United States Patent
Kim et al.

(10) Patent No.: US 10,999,848 B2
(45) Date of Patent: May 4, 2021

(54) SPARSE-CODED AMBIENT BACKSCATTER COMMUNICATION METHOD AND SYSTEM

(71) Applicant: Research & Business Foundation Sungkyunkwan University, Suwon-si (KR)

(72) Inventors: Tae Yeong Kim, Seoul (KR); Dong In Kim, Seongnam-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 91 days.

(21) Appl. No.: 16/232,523

(22) Filed: Dec. 26, 2018

(65) Prior Publication Data
US 2020/0107324 A1    Apr. 2, 2020

(30) Foreign Application Priority Data

Oct. 1, 2018  (KR) .................. 10-2018-0116920
Oct. 1, 2018  (KR) .................. 10-2018-0116921

(51) Int. Cl.
*H03M 5/02*       (2006.01)
*H04W 72/04*      (2009.01)
(Continued)

(52) U.S. Cl.
CPC ..... *H04W 72/0466* (2013.01); *H04W 72/085* (2013.01); *H03M 13/11* (2013.01);
(Continued)

(58) Field of Classification Search
CPC ......... H03M 13/1102; H03M 13/1191; H03M 13/11; H03M 1/1245; H04W 4/80;
(Continued)

(56) References Cited

U.S. PATENT DOCUMENTS 9,325,621 B1 *  4/2016  Ramamurthy ........ H04W 28/08
9,477,292 B1 * 10/2016  Murali .................. G06F 9/4418
(Continued)

FOREIGN PATENT DOCUMENTS

KR    10-2016-0124223 A    10/2016

OTHER PUBLICATIONS

Zhou, Yongkang, et al. "SCMA codebook design based on constellation rotation." *2017 IEEE International Conference on Communications (ICC)*. IEEE, 2017 (6 pages in English).
(Continued)

*Primary Examiner* — Linh V Nguyen
(74) *Attorney, Agent, or Firm* — NSIP Law

(57) ABSTRACT

The present disclosure relates to a sparse-coded ambient backscatter communication method and a system. According to the sparse-coded ambient backscatter communication method, in an ambient backscatter system including an access point and a plurality of sensor nodes, each sensor node transmits a code word in a non-orthogonal multiple access (NOMA) manner using sparsity of a signal by a duty cycling operation and the access point detects a superimposed signal transmitted in the NOMA manner by an iterative decoding method in which a dyadic channel and intersymbol interference are reflected. The present disclosure may reduce the implementation cost by reducing the number of impedances required to modulate data of a batteryless sensor node in an Internet of Things environment and utilize the dyadic backscatter channel to detect a signal, thereby providing massive connectivity of the access point.

18 Claims, 14 Drawing Sheets

(51) Int. Cl.
*H04W 72/08* (2009.01)
*H04W 88/08* (2009.01)
*H03M 13/11* (2006.01)

(52) U.S. Cl.
CPC ..... *H03M 13/1102* (2013.01); *H03M 13/1191* (2013.01); *H04W 88/08* (2013.01)

(58) Field of Classification Search
CPC ....... H04W 4/023; H04W 16/20; H04W 4/35; H04W 16/18; H04W 4/029; H04W 4/185; H04W 4/38; H04W 84/18; H04W 88/02; H04W 8/005; H04W 12/00503; H04W 12/12; H04W 24/00; H04W 64/00; H04W 72/0466; H04W 72/085; H04W 88/08
USPC .............................................. 341/57, 51, 56
See application file for complete search history.

(56) References Cited

U.S. PATENT DOCUMENTS

| | | | | |
|---|---|---|---|---|
| 9,743,357 | B2* | 8/2017 | Tabe | H04W 52/0245 |
| 2006/0008082 | A1* | 1/2006 | Gluck | H04L 63/08 |
| | | | | 380/28 |
| 2010/0040011 | A1* | 2/2010 | Kang | H04W 76/28 |
| | | | | 370/329 |
| 2010/0219789 | A1* | 9/2010 | Bermak | G01L 1/26 |
| | | | | 320/101 |
| 2012/0115498 | A1* | 5/2012 | Kim | H04W 52/244 |
| | | | | 455/452.2 |
| 2014/0278853 | A1* | 9/2014 | Brown | G06Q 30/0209 |
| | | | | 705/14.12 |
| 2015/0120073 | A1* | 4/2015 | Ghosh | G06Q 50/06 |
| | | | | 700/291 |
| 2015/0128733 | A1* | 5/2015 | Taylor | H02J 50/001 |
| | | | | 73/865.8 |
| 2017/0164237 | A1* | 6/2017 | Mahmoodi | H04W 24/08 |
| 2019/0150197 | A1* | 5/2019 | Sheu | H04W 72/02 |
| | | | | 370/329 |

OTHER PUBLICATIONS

Lu, Xiao, et al. "Ambient backscatter assisted wireless powered communications." IEEE Wireless Communications 25.2 (2018): 170-177 (8 pages in English).
Korean Office Action dated Feb. 14, 2020 in counterpart Korean Patent Application No. 10-2018-0116920 (4 pages in Korean).
Korean Office Action dated Oct. 15, 2020 in counterpart Korean Patent Application No. 10-2018-0116920 (2 pages in Korean).
Cnaan-On, Itay. "Using Coding to Improve Localization and Backscatter Communication Performance in Low-Power Sensor Networks." Diss. Duke University, Durham, NC, USA, 2016 (140 pages in English).
Korean office action dated Oct. 1, 2019 in counterpart Korean Patent Application No. 10-2018-0116921 (4 pages in Korean).
Korean office action dated Jan. 9, 2020 in counterpart Korean Patent Application No. 10-2018-0116921 (2 pages in Korean).

* cited by examiner

[FIG. 1]
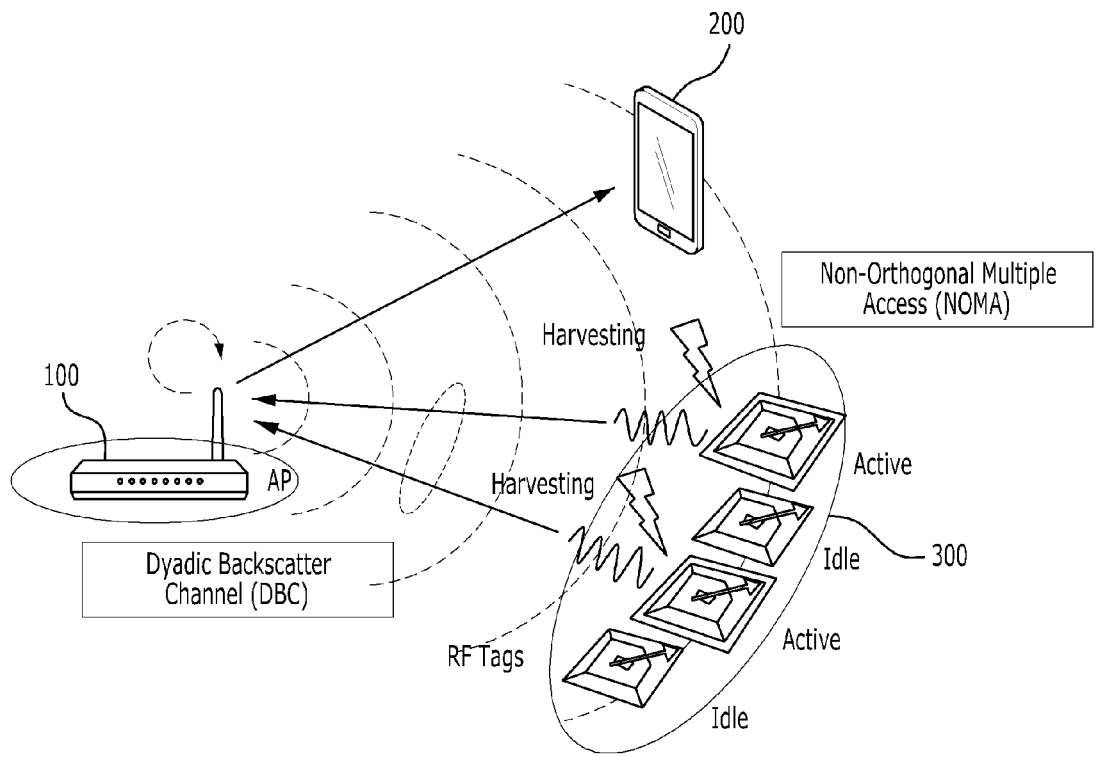
[FIG. 2]
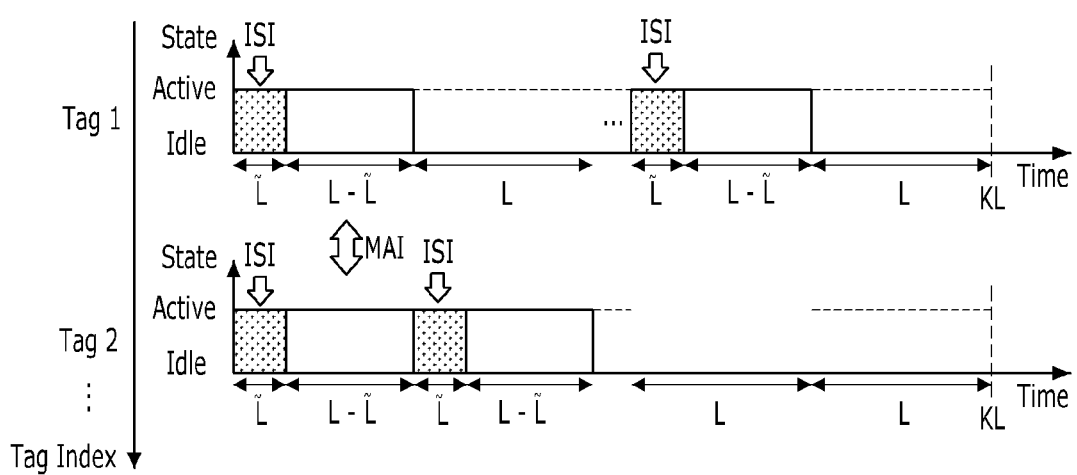

[FIG. 3]
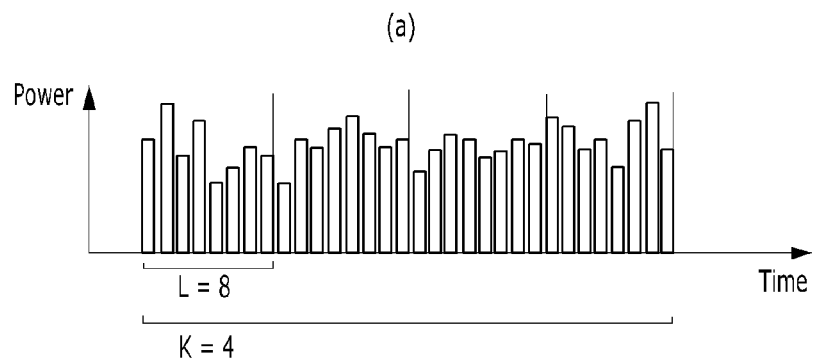
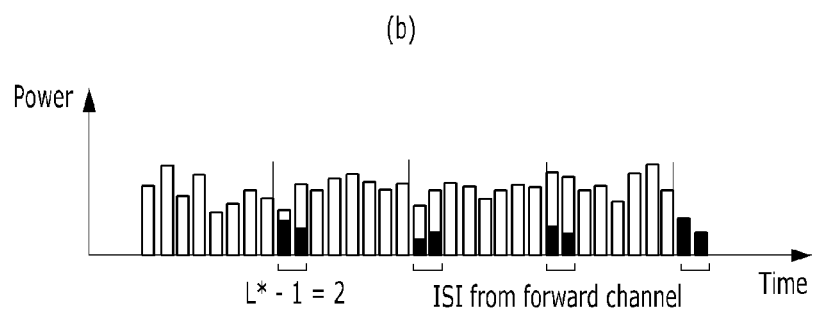
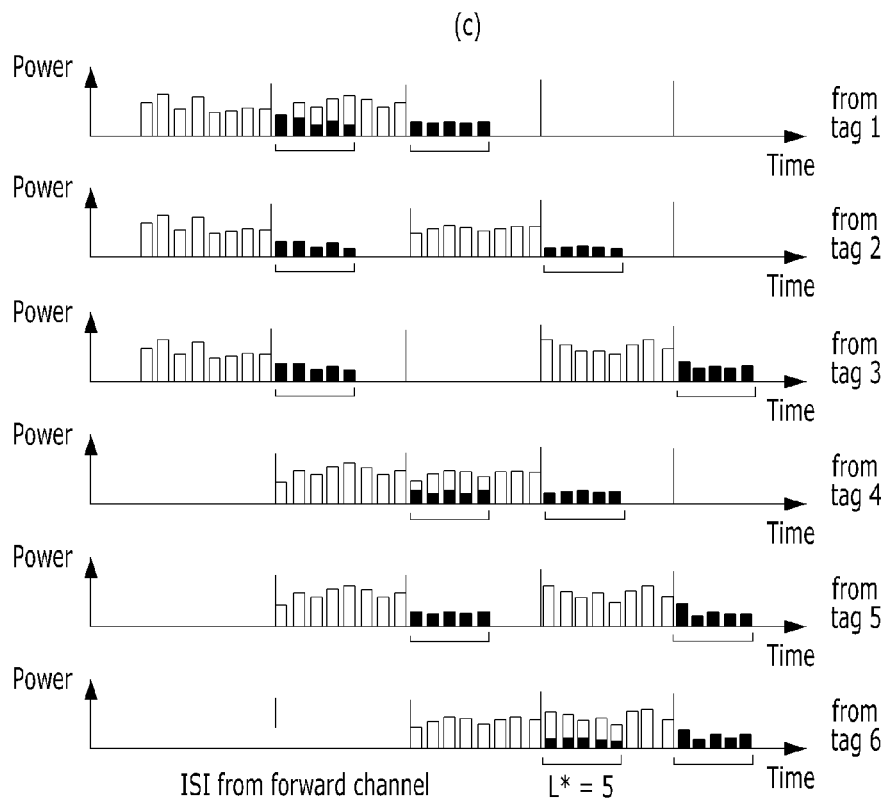

[FIG. 4]
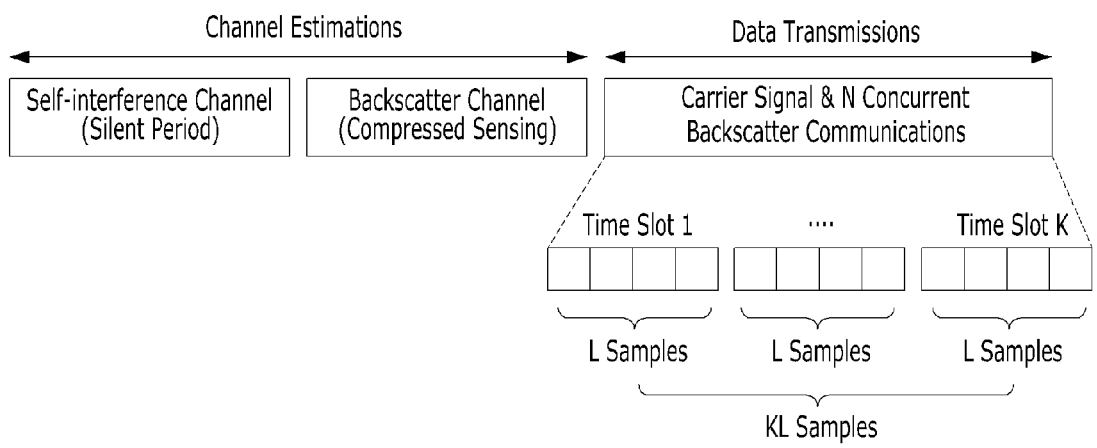

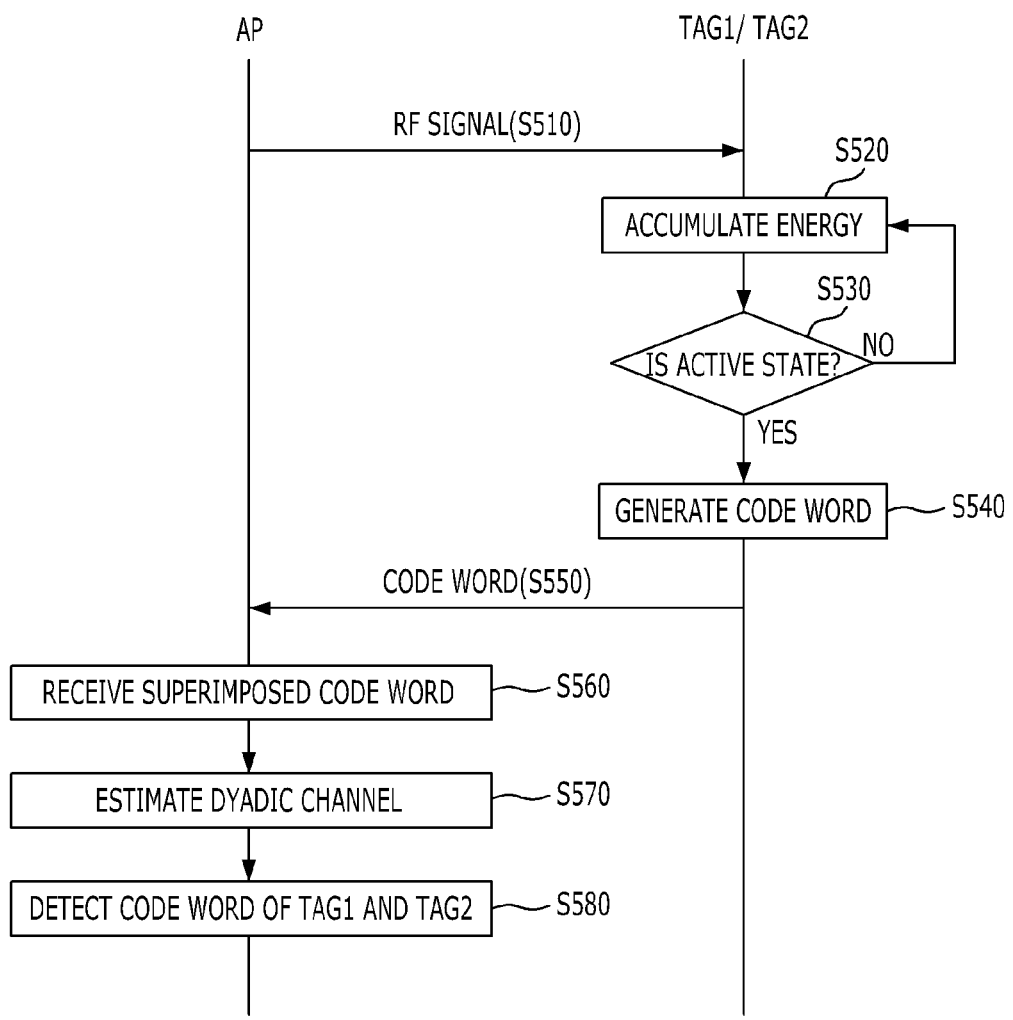
[FIG. 5]

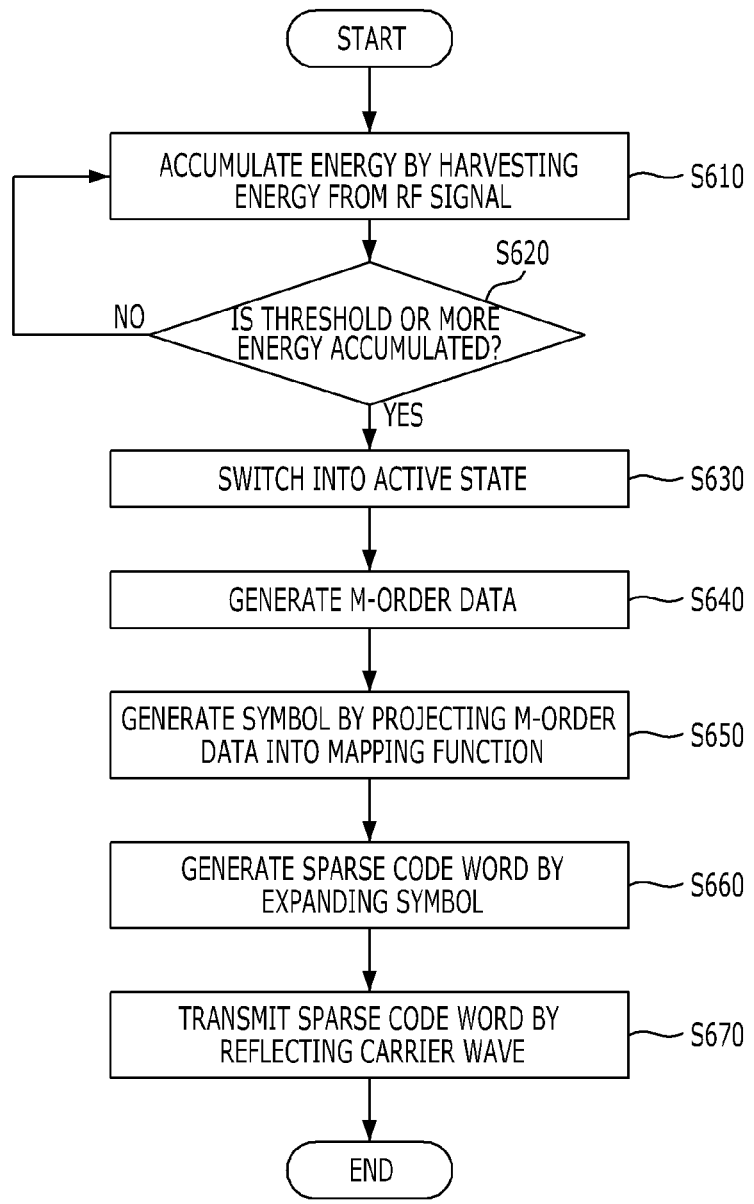

[FIG. 7]
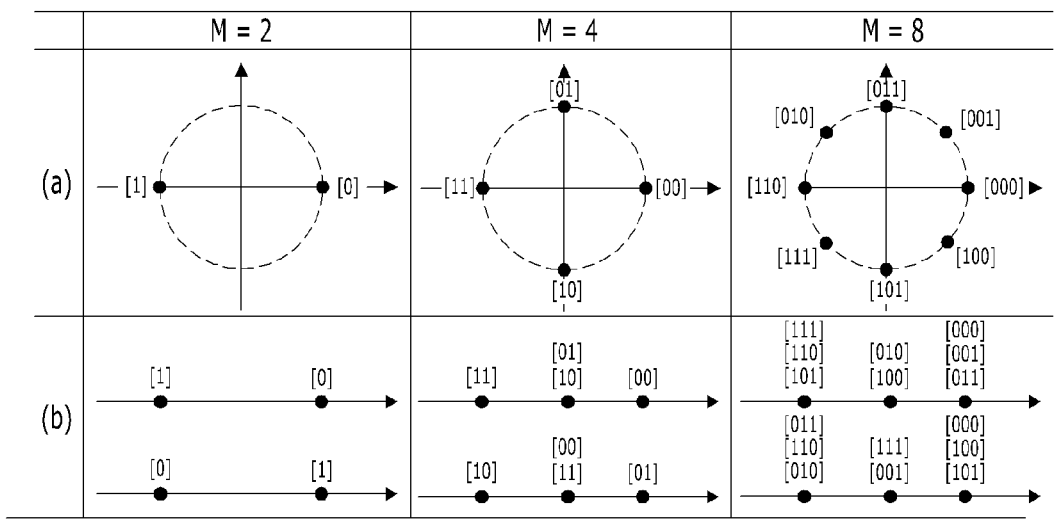
[FIG. 8]
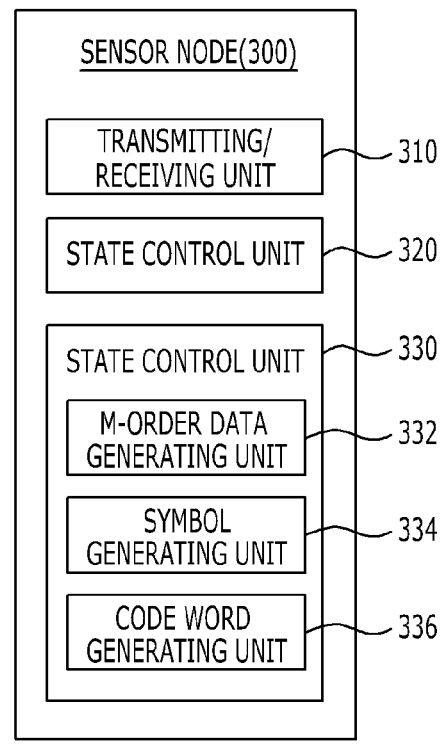

[FIG. 9]
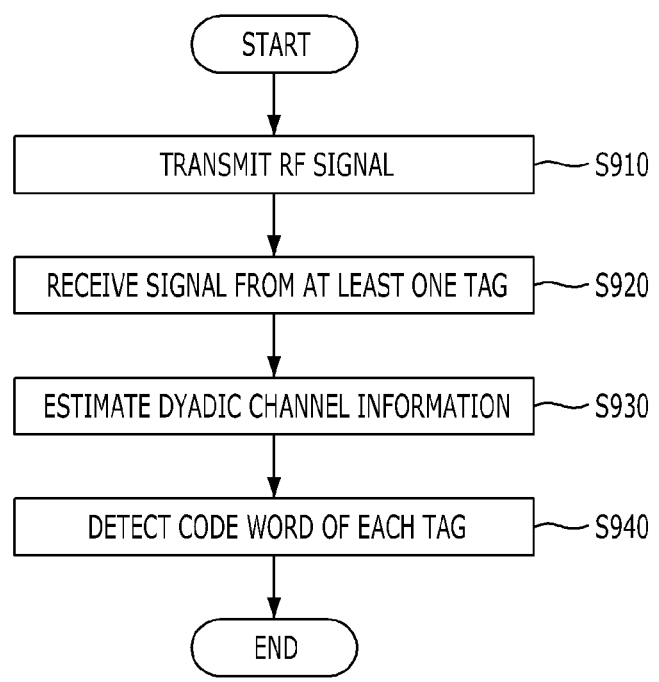

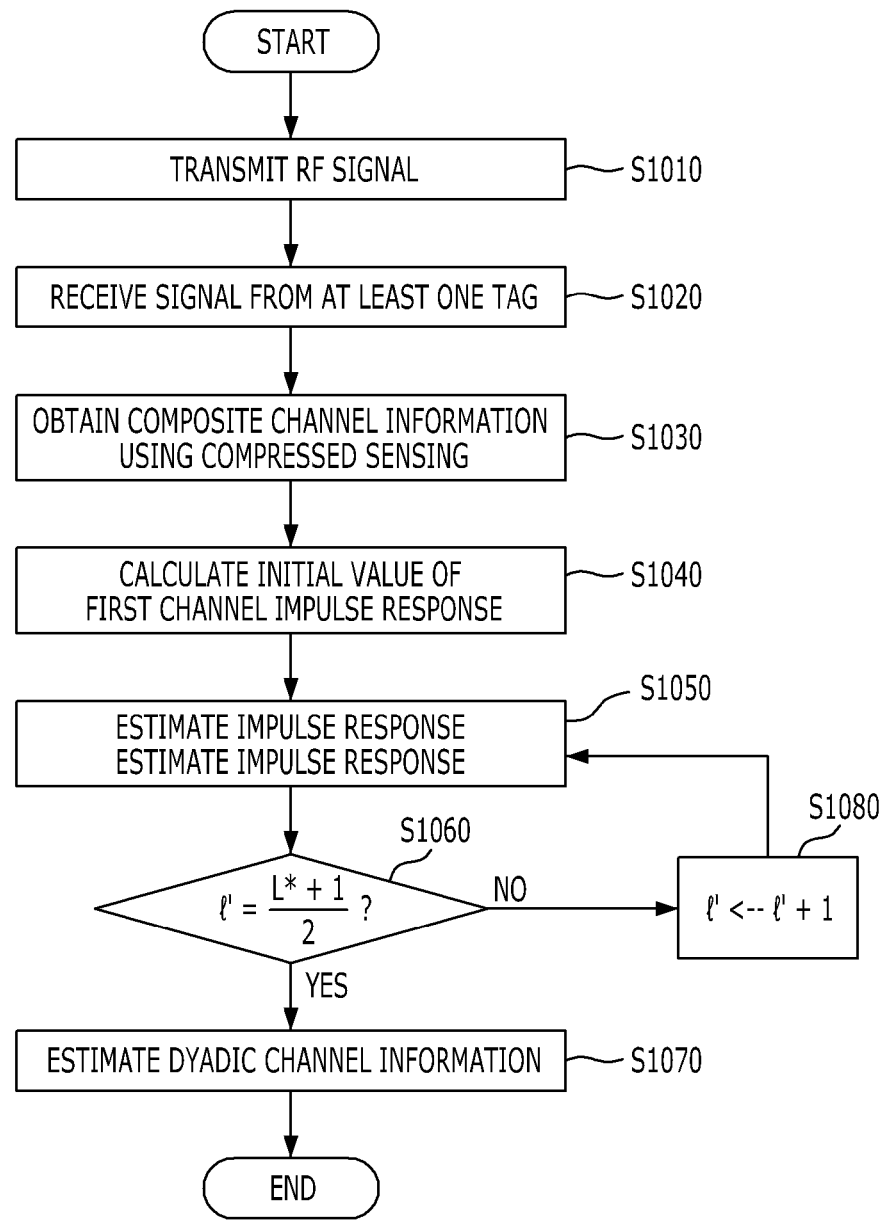

[FIG. 11]
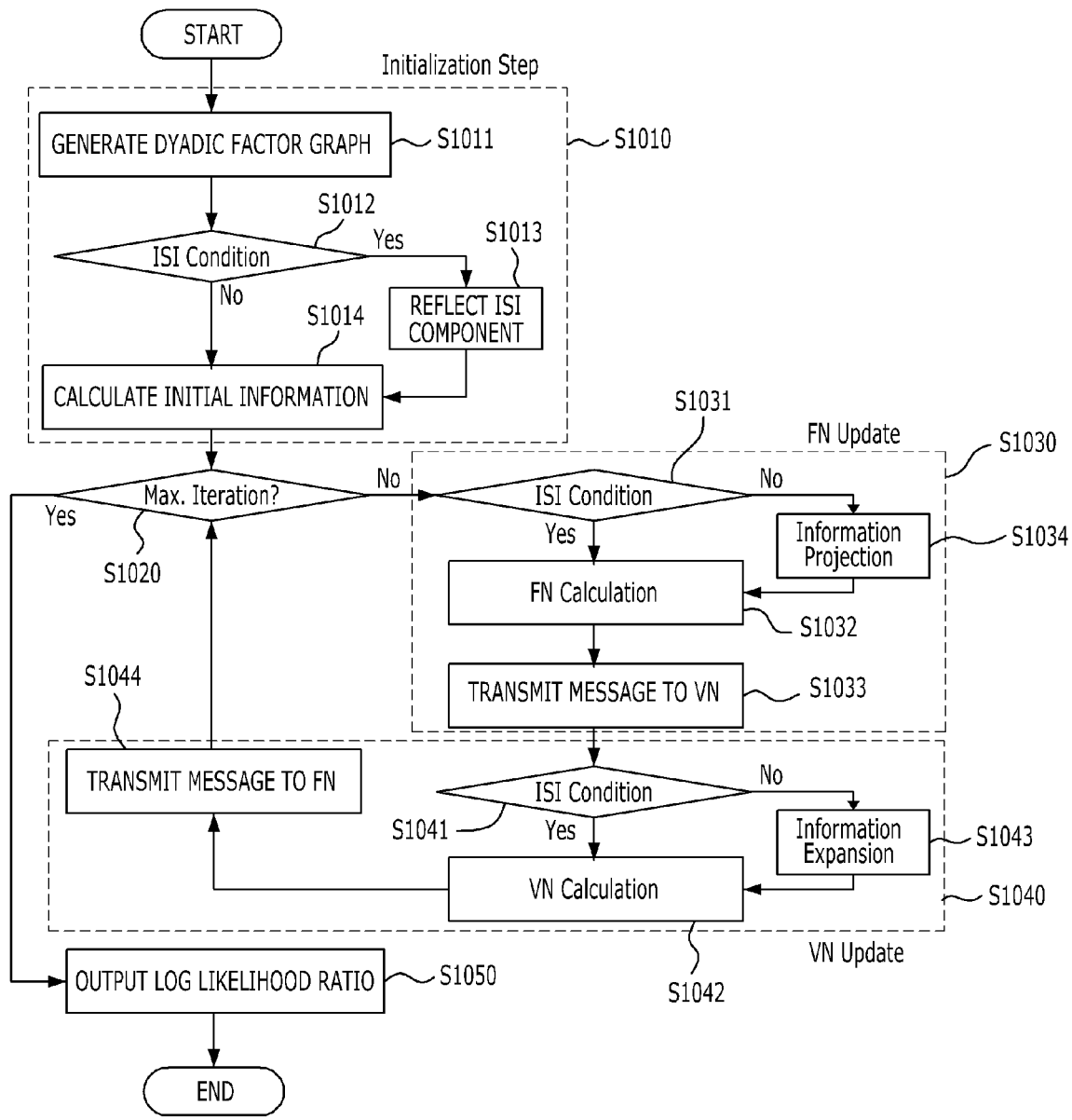

[FIG. 12]
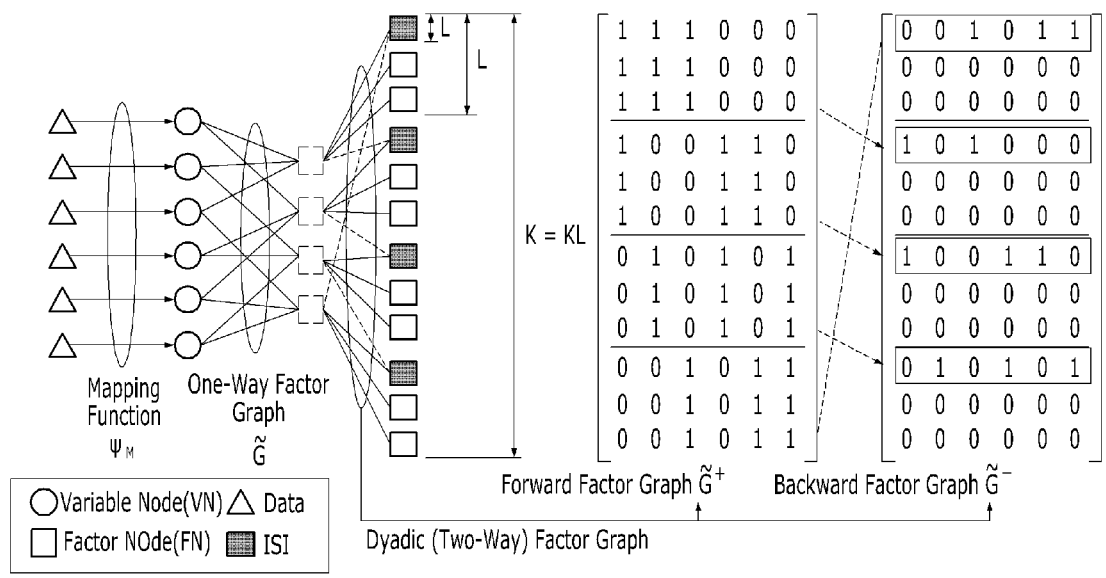
[FIG. 13]
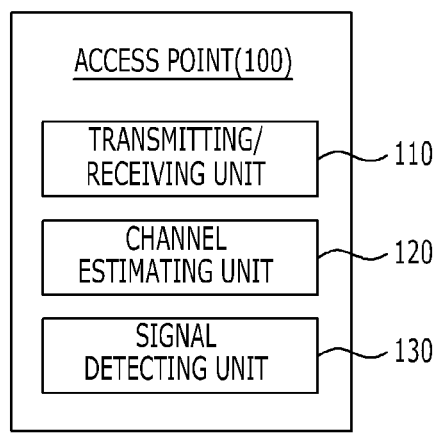

[FIG. 14]
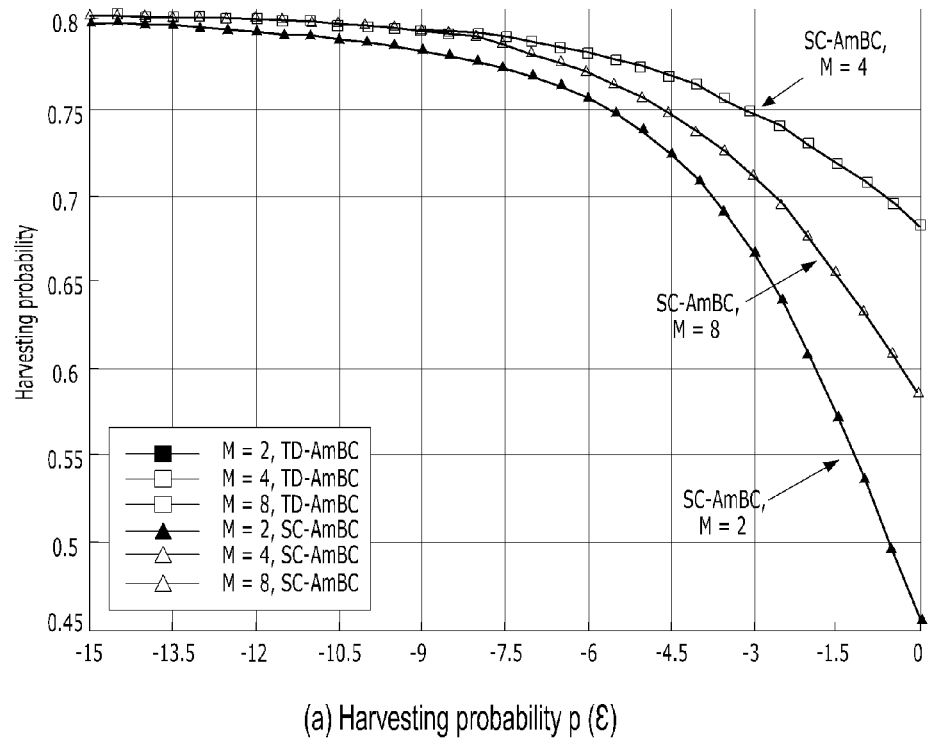
(a) Harvesting probability p (ε)
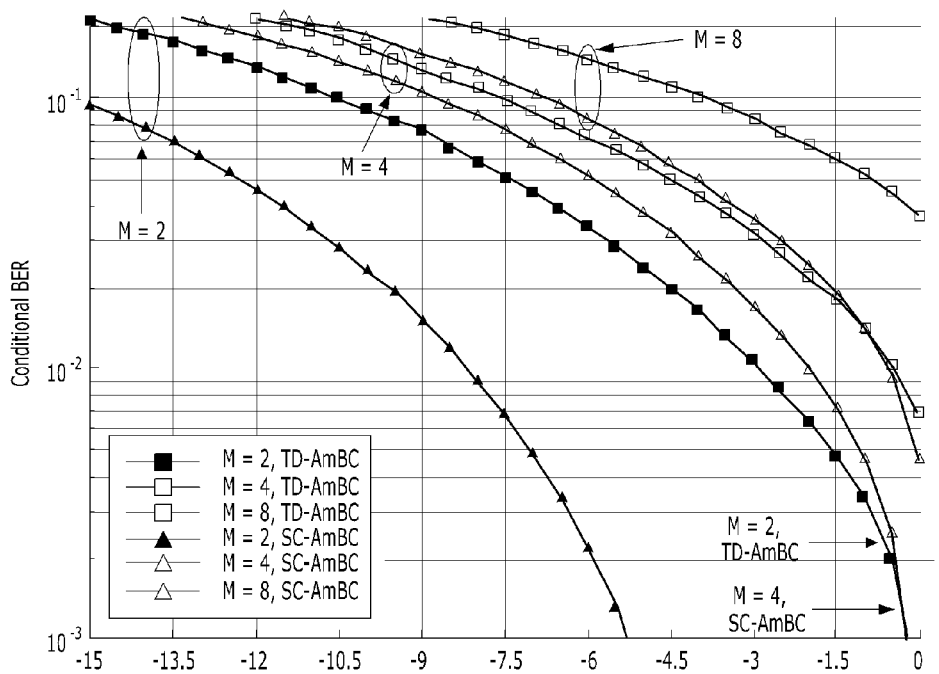
(b) Conditional BER 1 - p ($\hat{L}$ | ε)

[FIG. 15]
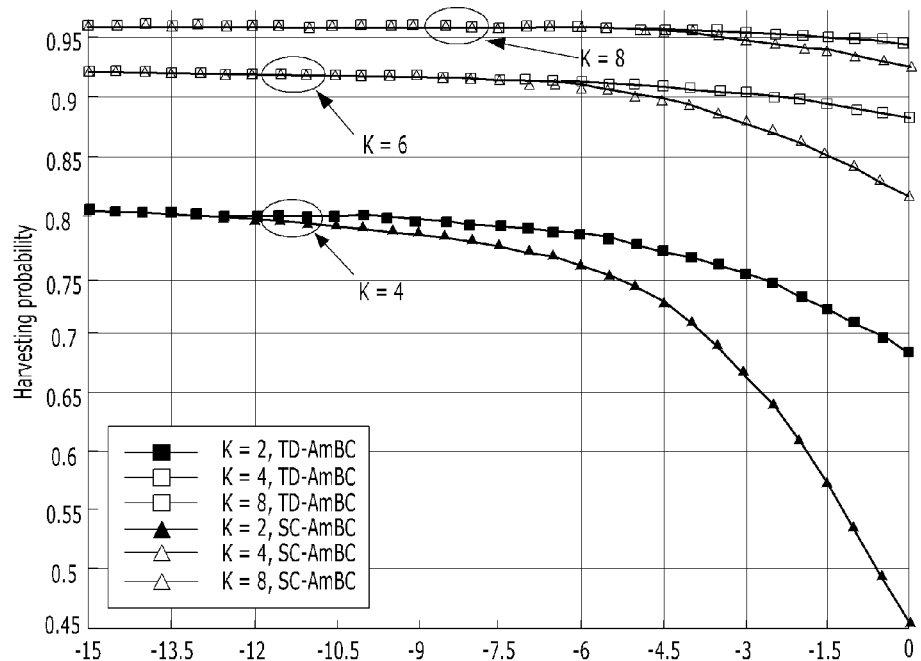
(a) Harvesting probability $p(\mathcal{E})$
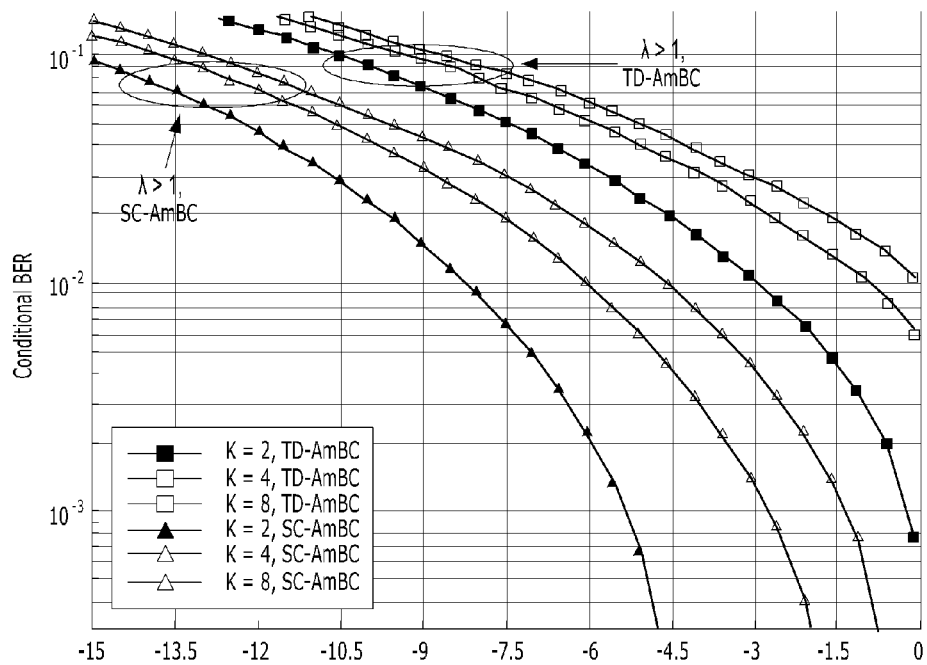
(b) Conditional BER $1 - p(\hat{L} | \mathcal{E})$

[FIG. 16]
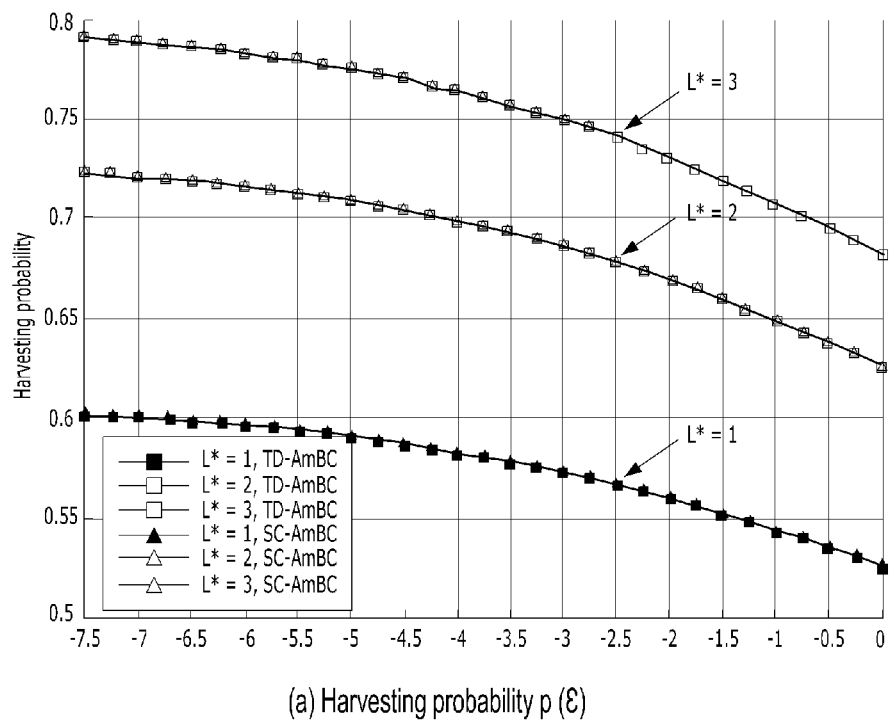
(a) Harvesting probability p (ε)
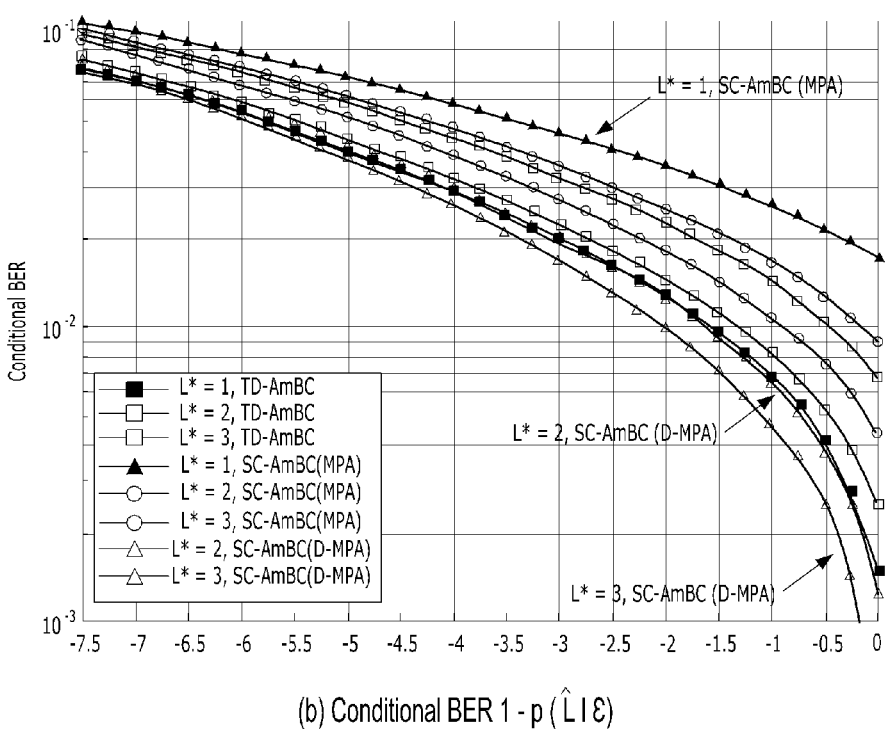
(b) Conditional BER 1 - p ($\hat{L}$ | ε)

[FIG. 17]
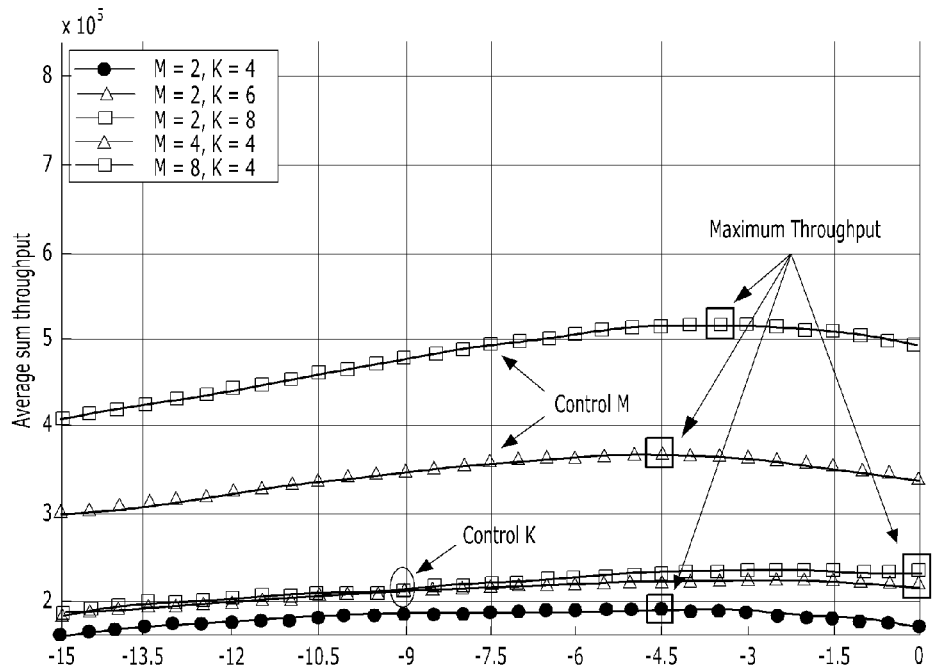
(a) Average sum throughput C (TD-AmBC)
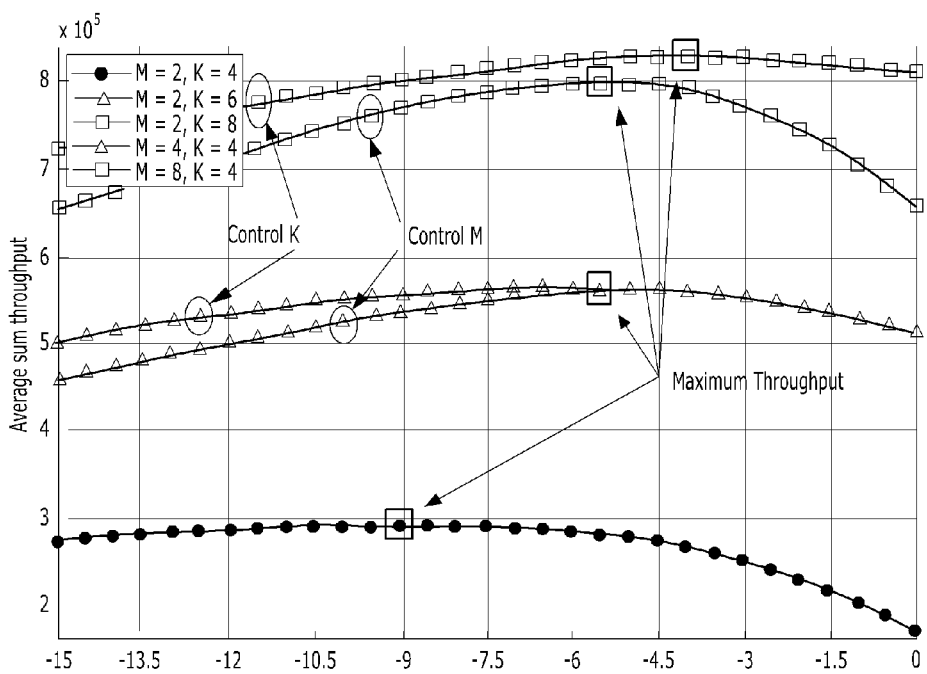
(b) Average sum throughput C (SC-AmBC)

SPARSE-CODED AMBIENT BACKSCATTER COMMUNICATION METHOD AND SYSTEM

CROSS-REFERENCE TO RELATED APPLICATIONS

This application claims the priority of Korean Patent Application No. 10-2018-0116920 filed on Oct. 1, 2018, in the Korean Intellectual Property Office, the disclosure of which is incorporated herein by reference.

BACKGROUND

Field

The present disclosure relates to a sparse-coded ambient backscatter communication method and system, and more particularly, to a sparse-coded ambient backscatter communication method and a system therefor which transmit sparse codes generated by sensor nodes in a non-orthogonal multiple access (NOMA) manner and detect a non-orthogonal multiple access signal coded into a sparse code by an access point (AP) to support massive connectivity in a RF energy harvesting based ambient backscatter communication (AmBC).

Description of the Related Art

There are techniques for transmitting tag data using an ambient backscatter communication (AmBC) technique for TV signals or WiFi signals in an Internet of Things environment. Further, techniques have been proposed in which a tag modulates data by backscattering and an access point (AP) detects the data. For example, there is a duty-cycling operation in which the tag collects sufficient energy required to transmit data through energy harvesting in a WiFi-based AmBC environment and backscatters the data to be transmitted, and to this end, there are scheduling techniques for allocating time required for energy harvesting and data transmission of the tag. Further, there is a method in which the tag modulates data in an M-ary phase shift keying manner and a WiFi access point recovers a damaged portion of the backscattered signal through a dyadic channel due to the Intersymbol interference (ISI) and detects a signal in the extended time domain using a maximal-ratio combining (MRC) method.

Such a resource allocating technique corresponds to an orthogonal multiple access (OMA) which divides a time to perform multiple access and access for only one tag is permitted in one time slot to avoid multiple access interference (MAI). In the meantime, a time-division multiple access (TDMA) manner is used for transmission of tags so that an environment where multiple access interference (MAI) is free is assumed.

Further, a method for implementing a tag by connecting impedance as many as a modulation order to a microcontroller unit has been suggested to utilize M-ary modulation at the tag.

However, in the AmBC technique of the related art, an orthogonal multiple access (OMA) environment from which both ISI and MAI are excluded is mainly treated so that it is not appropriate to support massive connectivity. Further, a load impedance increases the size of the tag, so that an implementation cost of the tag is also increased. Further, since the AmBC technique of the related art significantly depends on a duty-cycling operation, there is a disadvantage in that a transmission rate of a communication network is significantly lowered in a RF environment with a low energy harvesting efficiency or a network densification environment. Further, since a structure of a dyadic channel appearing in a backscatter communication is not reflected in the signal detection, there is a disadvantage in terms of the signal-to-noise ratio (SNR). Furthermore, since signal sparsity is not utilized, there is a disadvantage in that a RF energy harvesting efficiency is low and a transmission rate is lowered in a high density network environment.

As a related art, there is Korean Unexamined Patent Application Publication No. 10-2018-0087917 (entitled a backscatter communication method using variable power level and a tag therefor).

SUMMARY

An object to be achieved by the present invention is to provide a sparse-coded ambient backscatter communication method and system which support massive connectivity in a RF energy harvesting based ambient backscatter communication (AmBC), to improve an energy harvesting efficiency and a signal detecting performance of a sensor node therethrough, and to obtain a diversity gain by utilizing both MAI and ISI to detect a backscattered signal at an access point.

Another object to be achieved by the present disclosure is to provide a sparse-coded ambient backscatter communication method and system which implement low latency communication by reducing an overhead due to scheduling and RF resource allocation in an ambient backscatter system and improve a performance of a duty-cycling operation of the sensor node.

Still another object to be achieved by the present disclosure is to provide a sparse-coded ambient backscatter communication method and system which implement a low-complexity algorithm by utilizing a unique sparsity of a signal for iterative decoding in an ambient backscatter system and design a signal reception technique having a robust characteristic of a dyadic channel environment to significantly improve a quality-of-service (QoS) of a massive Internet of Things communication network.

Technical problems of the present disclosure are not limited to the above-mentioned technical problem(s), and other technical problem(s), which is (are) not mentioned above, can be clearly understood by those skilled in the art from the following descriptions.

According to an aspect of the present disclosure, a sparse-coded ambient backscatter communication method includes: accumulating energy by harvesting energy from a RF (radio frequency) signal emitted from the access point; generating M-ary data when a predetermined threshold or more energy is accumulated to be switched into an active state; generating a symbol by projecting the M-ary data into a predefined mapping function; generating a code word by spreading the symbol; and transmitting the code word by reflecting a carrier wave received from the access point; in which the plurality of sensor nodes transmits their specific code word in a non-orthogonal multiple access (NOMA) manner.

The symbol may be generated by at least one of 1, 0, −1 and has an active time slot length.

The code word may be a sparse code word having a length corresponding to a multiplication of a number of time slots and a symbol period.

The code word may be transmitted to the access point through a dyadic channel.

Further, the sparse-coded ambient backscatter communication method may further include: receiving a signal transmitted from the plurality of sensor nodes in a non-orthogonal multiple access (NOMA) manner; estimating a dyadic channel of the received signal using compressed sensing and channel reciprocity; and repeatedly updating information of a factor node and a variable node as many as a predetermined number of iterations in consideration of the estimated dyadic channel and the intersymbol interference (ISI) and detecting data of the plurality of sensor nodes based on the updated result.

The received signal is a signal passing through a dyadic forward channel and a dyadic backward channel.

The estimating of a dyadic channel includes: obtaining composite channel information using compressed sensing; calculating an initial value of a first channel impulse response using channel reciprocity based on the composite channel information; estimating an impulse response of the remaining channels according to a time based on the initial value of the first channel impulse response; and estimating a dyadic forward channel and a dyadic backward channel using the estimated impulse response of the channels.

The dyadic forward channel $\tilde{h}_{k,n}{}^+$ and the dyadic backward channel $\tilde{h}_{k,n}{}^-$ are estimated using the following Equation.

$$\tilde{h}_{k,n}{}^+ = F_n{}^+ F_n{}^+ s_k + F_n{}^+ F_n{}^- s_{k-1}$$

$$\tilde{h}_{k,n}{}^- = F_n{}^- F_n{}^+ s_{k-1}$$

(Here, $s_k$ is a signal transmitted in a time slot k, $s_{k-1}$ is a signal transmitted in a time slot k−1, $F_n{}^+$ and $F_n{}^-$ are Toeplitz matrices.)

The detecting of data of the plurality of sensor nodes includes: generating a dyadic factor graph; determining whether ISI information is reflected based on a channel impulse response obtained at the time of estimating a dyadic channel and calculating initial information by selectively reflecting ISI information in accordance with the determination result; determining whether there is ISI based on the dyadic factor graph, selectively projecting code word information in accordance with the determination result to update information of a factor node, and transmitting a first message including the updated information to a variable node; determining whether there is ISI based on the message, selectively spreading the projected code word information in accordance with the determination result to update information of a variable node, and transmitting a second message including the updated information to the factor node; outputting a log likelihood ratio when the process of transmitting the first message and the second message is repeated as many as the number of iterations; and detecting data of each sensor node based on the log likelihood ratio.

In the calculating of initial information, with respect to a threshold time when the ISI is generated in the channel impulse response, a signal within the threshold time reflects the ISI information to calculate the initial information.

The transmitting of a first message to a variable node includes: determining whether there is ISI based on the number of "1"s of each row in the dyadic factor graph; and calculating a first message with a size of M in a factor node to transmit the first message to a variable node when there is ISI as a result of determination and to transmit the first message with a size of $\tilde{M}$=min(M, 3) by projecting code word information when there is no ISI.

The transmitting of a second message to a factor node includes: determining whether there is ISI based on the number of "1"s of each row in the dyadic factor graph; and calculating a second message with a size of M in a variable node without projection to transmit the second message to a factor node when there is ISI as a result of determination and to transmit the second message with a size of M to the factor node by spreading information of the projected code word with a size of $\tilde{M}$ when there is no ISI.

In the detecting of data of each of sensor nodes, when the log likelihood ratio is a positive value, data is decoded to be "0" and when the log likelihood ratio is a negative value, data is decoded to be "−1" to detect a code word of each sensor node.

According to another aspect of the present disclosure, a sparse-coded ambient backscatter system includes: a plurality of sensor nodes which accumulates energy by harvesting energy from an ambient RF signal, generates a symbol by projecting M-ary data into a predefined mapping function when a predetermined threshold or more energy is accumulated to be switched into an active state, spreads the symbol to generate a sparse code word, and transmits the sparse code word in a non-orthogonal multiple access (NOMA) manner by reflecting a carrier wave received from an access point; and an access point which estimates a dyadic channel of a signal received from the plurality of sensor nodes using compressed sensing and channel reciprocity, repeatedly updates information of a factor node and a variable node as many as a predetermined number of iterations in consideration of the estimated dyadic channel and intersymbol interference (ISI), and detects data of the plurality of sensor nodes based on the updated result.

The sensor node includes: a transmitting/receiving unit for communication with an access point; a state control unit which accumulates energy by harvesting energy from a RF signal received through the transmitting/receiving unit in an idle state and is switched into an active state when a predetermined threshold or more energy is accumulated; and a modulating unit which projects M-ary data into a predefined mapping function to generate a symbol when it is switched into an active state, and transmits the code word by reflecting a carrier wave received from the access point.

The access point includes: a transmitting/receiving unit which receives a signal transmitted from the plurality of sensor nodes in a non-orthogonal multiple access (NOMA) manner; a channel estimating unit which estimates a dyadic channel of the received signal using compressed sensing and channel reciprocity; and a signal detecting unit which repeatedly updates information of a factor node and a variable node as many as a predetermined number of iterations in consideration of the estimated dyadic channel and the intersymbol interference (ISI) and detects data of the plurality of sensor nodes based on the updated result.

The channel estimating unit obtains composite channel information using compressed sensing, calculates an initial value of a first channel impulse response using channel reciprocity based on the composite channel information, estimates impulse responses of the remaining channels in accordance with a time based on the initial value of the first channel impulse response, and estimates a dyadic forward channel and a dyadic backward channel using the estimated impulse response of the channel.

The signal detecting unit generates a dyadic factor graph, determines whether there is ISI based on the dyadic factor graph, updates information of a factor node by selectively projecting code word information in accordance with a determination result, updates information of a variable node by spreading the projected code word information depending on whether there is ISI, outputs a log likelihood ratio when the information of the factor node and the variable node is updated as many as the number of iterations, and detects data of each sensor node based on the log likelihood ratio.

The SC-AmBC according to the present disclosure allows M-ary modulation and non-orthogonal multiple access of a sensor node (tag) to support massive connectivity and effectively detects the received signal using a temporal diversity in a time domain.

Further, a sparse code of the present disclosure utilizes both MAI and ISI to detect a backscatter signal without discarding the MAI and ISI so that the diversity gain may be obtained and the bit error rate is also reduced. Therefore, the present disclosure may be applied to a smart home built on the basis of the WiFi and applied to a communication network in which low power RF devices are densely deployed and ambient backscatter to enhance quality-of-service (QoS). Specifically, the present disclosure may be intimately utilized to support massive connectivity of tags in a low power Internet of Things communication network.

The effects of the present disclosure are not limited to the aforementioned effects, and various other effects are included within a range which is obvious to those skilled in the art from the following description.

BRIEF DESCRIPTION OF THE DRAWINGS

The above and other aspects, features and other advantages of the present disclosure will be more clearly understood from the following detailed description taken in conjunction with the accompanying drawings, in which:

FIG. 1 is a view for explaining a sparse-coded ambient backscatter system (SC-AmBC) according to an exemplary embodiment of the present disclosure;

FIG. 2 is a view for explaining duty cycling of a sparse-coded ambient backscatter system according to an exemplary embodiment of the present disclosure;

FIG. 3 is a view for explaining a signal which is transmitted and received in SC-AmBC according to an exemplary embodiment of the present disclosure;

FIG. 4 is a view for explaining a protocol structure of SC-AmBC according to an exemplary embodiment of the present disclosure;

FIG. 5 is a view for explaining an operation of a sparse-coded ambient backscatter system (SC-AmBC) according to an exemplary embodiment of the present disclosure;

FIG. 6 is a view for explaining a method of transmitting data by a tag according to an exemplary embodiment of the present disclosure;

FIG. 7 is a view for explaining a mapping function of SC-AmBC according to an exemplary embodiment of the present disclosure;

FIG. 8 is a view for explaining a sensor node according to an exemplary embodiment of the present disclosure;

FIG. 9 is a view illustrating an operation of an access point according to an exemplary embodiment of the present disclosure;

FIG. 10 is a view for explaining a method for estimating a channel by an access point according to an exemplary embodiment of the present disclosure;

FIG. 11 is a view for explaining a method for detecting a backscatter signal according to an exemplary embodiment of the present disclosure;

FIG. 12 is a view for explaining a dyadic factor graph according to an exemplary embodiment of the present disclosure;

FIG. 13 is a view for explaining a configuration of an access point according to an exemplary embodiment of the present disclosure;

FIG. 14 is a graph for comparing M-ary modulation performances of an SC-AmBC manner of the present disclosure and a TD-AmBC manner of the related art;

FIG. 15 is a graph for comparing duty cycling operation performances of an SC-AmBC manner of the present disclosure and a TD-AmBC manner of the related art;

FIG. 16 is a graph for comparing performances in a dyadic channel of an SC-AmBC manner of the present disclosure and a TD-AmBC manner of the related art; and FIG. 17 is a graph for comparing performances according to a reflection coefficient of an SC-AmBC manner of the present disclosure and a TD-AmBC manner of the related art.

DETAILED DESCRIPTION OF THE EMBODIMENT

Those skilled in the art may make various modifications to the present invention and the present invention may have various embodiments thereof, and thus specific embodiments will be illustrated in the drawings and described in detail in the detailed description. However it should be understood that the invention is not limited to the specific embodiments, but includes all changes, equivalents, or alternatives which are included in the spirit and technical scope of the present invention. In the description of respective drawings, similar reference numerals designate similar elements.

Terms such as first, second, A, or B may be used to describe various components but the components are not limited by the above terms. The above terms are used only to discriminate one component from the other component. For example, without departing from the scope of the present invention, a first component may be referred to as a second component, and similarly, a second component may be referred to as a first component. The term "and/or" includes combinations of a plurality of related elements or any one of the plurality of related elements.

It should be understood that, when it is described that an element is "coupled" or "connected" to another element, the element may be directly coupled or directly connected to the other element or coupled or connected to the other element through a third element. In contrast, when it is described that an element is "directly coupled" or "directly connected" to another element, it should be understood that no element is present therebetween.

Terms used in the present application are used only to describe a specific exemplary embodiment, but are not intended to limit the present invention. A singular form may include a plural form if there is no clearly opposite meaning in the context. In the present application, it should be understood that term "include" or "have" indicates that a feature, a number, a step, an operation, a component, a part or the combination those of described in the specification is present, but do not exclude a possibility of presence or addition of one or more other features, numbers, steps, operations, components, parts or combinations, in advance.

If it is not contrarily defined, all terms used herein including technological or scientific terms have the same meaning as those generally understood by a person with ordinary skill in the art. Terms which are defined in a generally used dictionary should be interpreted to have the same meaning as the meaning in the context of the related art but are not interpreted as an ideally or excessively formal meaning if it is not clearly defined in the present invention.

Prior to full description, terms described in the specification will be described or defined.

Non-orthogonal multiple access (NOMA) is a technique of allowing a plurality of devices to share the same non-orthogonal time/frequency resources to increase a performance of a system and enhance scheduling fairness for devices.

In the NOMA system, the access point allocates the same time/frequency resource to a plurality of devices and multiple devices concurrently transmit superimposed signals. The access point iteratively decodes the received signal to restore the signal of each device.

Hereinafter, exemplary embodiments according to the present disclosure will be described in detail with reference to accompanying drawings.

FIG. 1 is a view for explaining a sparse-coded ambient backscatter system (SC-AmBC) according to an exemplary embodiment of the present disclosure, FIG. 2 is a view for explaining duty cycling of a sparse-coded ambient backscatter system according to an exemplary embodiment of the present disclosure, FIG. 3 is a view for explaining a signal which is transmitted and received in SC-AmBC according to an exemplary embodiment of the present disclosure, and FIG. 4 is a view for explaining a protocol structure of SC-AmBC according to an exemplary embodiment of the present disclosure.

Referring to FIG. 1, a sparse-coded ambient backscatter system (SC-AmBC) is configured to include an access point (AP) 100, a terminal device 200, and a sensor node 300.

The access point 100 emits an RF signal and supports the connection of a wireless network of ambient devices. For example, the access point broadcasts a WiFi RF signal to emit the WiFi RF signal. Further, the access point 100 may perform a process of supporting a connection of a wireless network of a connected terminal device 200 using the emitted RF signal.

The terminal device 200 refers to a device of a user which receives a RF signal emitted from the access point 100 and when a channel is established in accordance with a connection procedure with the access point 100, is connected to a wireless network through the established channel to transmit and receive data. Such a terminal device 200 may be configured to include a wireless Internet communication module, for example, a WiFi communication module, like a general mobile phone, a smart phone, a tablet PC, or a notebook. Further, when the sensor node 300 is a tag, the terminal device may also be referred to as a reader which is capable of tagging the tag.

The sensor node 300 is a batteryless device which does not include a dedicated power supply device (battery) and receives a RF signal from the access point 100 to harvest energy, that is, operates by charging a small amount of energy using a received RF signal. The sensor node 300 may be an ultra-small device or a portable device in which it is difficult to supply a power, such as a tag, an ultra-small sensor device, an IoT device, or a wearable device.

The sensor node 300 may absorb or reflect a RF signal emitted from the access point 100 and transmit information using the received RF signal through an ambient backscatter communication technique. That is, the sensor node 300 accumulates energy by harvesting energy from the RF signal emitted from the access point in an idle state and when a sufficient amount of energy is collected, switches into an active state to generate a code word for backscattering, in accordance with the duty-cycling operation. In this case, the sensor node 300 codes M-ary data with a small number of symbols by applying a method of projecting the code word into a mapping function. The code word is a sparse code word due to sparsity of the signal and modulates data into a multi-dimensional signal space so that it is robust against distortion and attenuation of the channel.

Further, the sensor node 300 loads the code word in a carrier wave received from the access point 100 to transmit the code word. In this case, the sensor nodes 300 transmit the code words in the NOMA manner so that the code words are superimposed to be transmitted and propagates through the dyadic channel. Further, when the code words are received by the access point 100, the code words are significantly distorted due to intersymbol interference.

In the meantime, as illustrated in FIG. 2, the duty-cycling of the system according to the present disclosure is configured such that cycles between tags are superimposed to generate multiple access interference (MAI) and the transmitted symbols are superimposed due to delay spread to generate intersymbol interference (ISI). Specifically, the tag is activated for time slots $K_1 < K$ among total K time slots so that the duty cycle D satisfies $D = K_1/K$. Further, since data is transmitted among tags in a non-orthogonal manner, the MAI is generated and intersymbol interference (ISI) is generated between $\overline{L}$ symbols in the code wow. If $$\overline{L} < L, N_1 = \binom{K-1}{K_1-1} < N$$

is satisfied, the interference may be mitigated by a message passing algorithm (MPA) using sparsity of the code word of a signal. Therefore, the access point 100 may detect the code word of each sensor node 300 from the superimposed code word using a low complexity algorithm such as a message passing algorithm (MPA).

In the meantime, the code words transmitted from the sensor nodes 300 propagates through the dyadic channel and when the code words are received by the access point, the code words are significantly distorted due to the ISI. That is, since the dyadic channel is configured by a forward channel and a backward channel, the signal is distorted twice due to the ISI so that the signal received by the access point 100 is significantly distorted.

The signal of the SC-AmBC will be described with reference to FIG. 3. As illustrated in FIG. 3A, a signal $s_k$ transmitted from the access point 100 propagates through the forward channel expressed by an impulse response $f_n = [f_n(1), \ldots, f_n(L_n^+)]^T$ so that as illustrated in FIG. 3B, the signal received by the tag n 300 is distorted by the ISI. In the meantime, a signal which is backscattered by a reflection coefficient $\Gamma_{k,n}$ in the tag 300 to reach the access point 100 passes through the backward channel to be distorted again. Therefore, as illustrated in FIG. 3C, significant parts of the received signal in the time domain are distorted.

As described above, since the dyadic channel is the composition of a forward channel and a backward channel and the signal is distorted twice by the ISI, the signal received by the access point 100 is significantly distorted. Therefore, a new channel estimation method which considers the signal distortion in the time domain is necessary.

Therefore, the access point 100 estimates the channel information using a dyadic channel estimation algorithm (D-CEA algorithm) and detects the superimposed sparse code word by applying the dyadic MPA (D-MPA). Here, the D-CEA algorithm and the dyadic MPA are algorithms which estimate a channel and detect a code word in consideration of the dyadic channel model and the ISI, which will be described in more detail below. The dyadic channel model exhibits a signal characteristic different from a Rayleigh fading channel which is mainly used in the existing wireless communication system and has unique characteristics of the backscatter communication, such as received signal distortion by the ISI or dual channel attenuation. Further, most receiving end structure for backscatter communication mainly uses a method of eliminating the ISI using a guard time or cyclic prefix so that a SNR loss can be incurred during this process. When the ISI is not canceled but is utilized for iterative passing algorithm in a time domain, the loss of SNR is prevented so that the received signal detecting performance is significantly improved.

In the meantime, the system configured as described above supports the non-orthogonal multiple access (NOMA), so that it has a protocol structure as illustrated in FIG. 4. Referring to FIG. 4, a protocol structure is configured by a channel estimation step and a data transmission step. In the channel estimation step, a self-interference channel for self-interference cancellation is estimated and a plurality of backscatter channels for NOMA is estimated. In the meantime, due to the sparsity of the signal, the backscatter channels may be estimated with a low complexity using a compressed sensing technique. In the data transmission step, when the access point 100 transmits a carrier wave signal for backscattering of the tag 300, N tags modulate the data utilizing the signal to transmit the data. In the data transmission step, a time is divided into K time slots and each time slot becomes L sampling periods.

The access point 100 may estimate the self-interference channel and the backscatter channel through the protocol with the above-described structure and the sensor nodes 300 harvest the energy using a signal emitted from the access point 100 or utilize the signal as a carrier wave for backscattering to transmit multiple data.

In the meantime, in FIG. 1, the sensor node 300 has been described, but for the convenience of description, description is limited to a tag.

FIG. 5 is a view for explaining an operation of a sparse-coded ambient backscatter system (SC-AmBC) according to an exemplary embodiment of the present disclosure.

Referring to FIG. 5, when the access point broadcasts an RF signal in step S510, a tag 1 and a tag 2 accumulate energy by harvesting energy from the RF signal received from the access point in step S520.

Next, when a predetermined threshold or more energy is accumulated, the tag 1 and the tag 2 are switched to an active state in step S530 and generate code words for backscattering in step S540. A method of generating a code word by the tag will be described in more detail below.

When step S540 is performed, the tag 1 and the tag 2 transmit the code word by reflecting the carrier wave received from the access point in step S550 and the access point receives the superimposed code words in step S560. In this case, the tag 1 and the tag 2 transmit the code words in the NOMA manner so that the code words are superimposed to be transmitted and propagates through the dyadic channel. Further, when the code words are received by the access point 100, the code words are significantly distorted due to ISI.

The access point which receives the code words superimposed by performing the step S560 estimates a dyadic channel in step S570 and detects the code words of the tag 1 and the tag 2 using the estimated dyadic channel in step S580. In this case, the access point estimates the channel information using a dyadic channel estimation algorithm (D-CEA) and detects the superimposed sparse code word by applying the dyadic MPA (D-MPA). That is, the access point estimates the dyadic channel of the signal received from the tag 1 and the tag 2 using compressed sensing and channel reciprocity, repeatedly updates the information of a factor node and a variable node as many as a predetermined number of iterations in consideration of the estimated dyadic channel and the intersymbol interference (ISI), and detects the code words of the tag 1 and the tag 2 based on the updated result.

FIG. 6 is a view for explaining a method of transmitting data by a tag according to an exemplary embodiment of the present disclosure and FIG. 7 is a view for explaining a mapping function of an SC-AmBC according to an exemplary embodiment of the present disclosure.

Referring to FIG. 6, the tag accumulates energy by harvesting energy from the RF signal received from the access point in an idle state in step S610 to determine whether a predetermined threshold value or more energy is accumulated in step S620.

As a result of determination in step S620, when the threshold value or more energy is accumulated, the tag is switched to the active state in step S630 to generate M-ary data in step S640.

That is, when the reception power is larger than a circuit power, the tag is switched to an active state. For example, when the reception power 500 nW>the circuit power 400 nW, the tag becomes an active state and when the reception power 300 nW<the circuit power 400 nW, the tag becomes an idle state.

When the tag is switched to the active state, the tag generates $\log_2$ M bit data.

For example, when the number of tags N is 6 and M is 4, each tag generates $\log_2$ 4 bit (2 bit) data. That is, each tag generates two bit data, for example, data of the tag 1 is [01], data of the tag 2 is [11], data of a tag 3 is [00], data of a tag 4 is [10], data of a tag 5 is [11], data of a tag 6 is [00].

When step S640 is performed, the tag projects the M-order data into a predefined mapping function to generate a symbol in step S650. In this case, the tag may generate symbols with an active time slot $K_1$ length by the mapping function. For example when $K_1$ is 2, the tag may project M-ary data into the mapping function to convert the data into a symbol with a length of 2.

Here, the projection means that the data reduces the number of coded symbols. For example, when there is no projection, if M is 4, four symbols of complex numbers 1, −1, j, and −j are necessary. In contrast, when the projection is applied, three symbols 1, 0, −1 are necessary as illustrated in FIG. 7B so that complexity required to implement the coding and decoding of the data may be significantly reduced.

Time-division based AmBC (TD-AmBC) of the related art generates a reflection coefficient mainly using an M-ary phase shift keying manner as illustrated in FIG. 7A. The signal modulation of the TD-AmBC uses a method of disposing signal points in a signal space mainly using M-PSK such that symbols are not superimposed. However, in the SC-AmBC according to the present disclosure, according to the signal modulation, symbols are superimposed to be transmitted so that only three types of symbols are present in the signal space. According to such a code word projection method, the number of load impedances required for a modulator of the tag is reduced to two. Further, a zero symbol supplies a constant amount of energy to a circuit of the tag similar to the on-off keying method so that an energy harvesting efficiency of the tag may be improved. As described above, according to the modulation method of the present disclosure, superimposition between symbols is allowed to be projected into three symbols.

According to this modulation method, the energy harvesting efficiency is improved and a manufacturing cost of a tag may be saved.

For example, the mapping function may be defined as follows:

Data [00]→Symbol [1, 0]
Data [01]→Symbol [0, 1]
Data [11]→Symbol [−1, 0]
Data [10]→Symbol [0, −1]

When the mapping function is defined as described above, each tag may generate symbols through the mapping function as represented in Table 1.

TABLE 1

|  | DATA |  | SYMBOL |
|---|---|---|---|
| TAG 1 | [01] | -> | [0, 1] |
| TAG 2 | [11] | -> | [−1, 0] |
| TAG 3 | [00] | -> | [1, 0] |
| TAG 4 | [10] | -> | [0, −1] |
| TAG 5 | [11] | -> | [−1, 0] |
| TAG 6 | [00] | -> | [1, 0] |

When step S650 is performed, a tag scatters the symbol generated in step S650 to generate a sparse code word in step S660 and transmits the sparse code word by reflecting the carrier wave in step S670. That is, the tag may finally convert a symbol with a length of an active time slot $K_1$ into a sparse code word with a length of KL. Here, K denotes the number of time slots, L denotes an integer value indicating a symbol period of the tag and symbols transmitted by the tag during L are repeatedly generated.

For example, when the sampling period of the carrier wave is 50 ns and a symbol period of the tag is 150 ns, L is 3, and when the number K of time slots is 4, a sparse code word may be generated to have a length of 12. In this case, the dyadic factor graph may be represented by the following matrix configured by 12 rows which is KL and 6 columns which is N.

$$\begin{pmatrix} 1 & 1 & 1 & 0 & 0 & 0 \\ 1 & 1 & 1 & 0 & 0 & 0 \\ 1 & 1 & 1 & 0 & 0 & 0 \\ 1 & 0 & 0 & 1 & 1 & 0 \\ 1 & 0 & 0 & 1 & 1 & 0 \\ 1 & 0 & 0 & 1 & 1 & 0 \\ 0 & 1 & 0 & 1 & 0 & 1 \\ 0 & 1 & 0 & 1 & 0 & 1 \\ 0 & 1 & 0 & 1 & 0 & 1 \\ 0 & 0 & 1 & 0 & 1 & 1 \\ 0 & 0 & 1 & 0 & 1 & 1 \\ 0 & 0 & 1 & 0 & 1 & 1 \end{pmatrix}$$

When the factor graph is used, a symbol with a length of 2 may be changed into a sparse code word with a length of 12. Each column of the factor graph is configured to have $(K_1 \times L)$ 1s.

If $K_1=2$ and L=3, the code word is generated such that in the factor graph, a first symbol is substituted for the first three 1s and a second symbol is substituted for the remaining three 1s.

That is, in order to generate a code word of a symbol [0, 1] of the tag 1, "0" is substituted for first three 1s and "1" is substituted for the remaining three 1s in the first column of the determinant. By doing this, the code word of the tag 1 may be generated to be [0, 0, 0, 1, 1, 1, 0, 0, 0, 0, 0, 0].

In order to generate a code word of a symbol [−1, 0] of the tag 2, "−1" is substituted for first three 1s and "0" is substituted for the remaining three 1s in the second column of the determinant. By doing this, the code word of the tag 2 may be generated to be [−1, −1, −1, 0, 0, 0, 0, 0, 0, 0, 0, 0]. In order to generate a code word of a symbol [1, 0] of the tag 3, "1" is substituted for first three 1s and "0" is substituted for the remaining three 1 s in the third column of the determinant. By doing this, the code word of the tag 3 may be generated to be [1, 1, 1, 0, 0, 0, 0, 0, 0, 0, 0, 0]. In order to generate a code word of a symbol [0, −1] of the tag 4, "0" is substituted for first three 1s and "−1" is substituted for the remaining three 1s in the fourth column of the determinant. By doing this, the code word of the tag 4 may be generated to be [0, 0, 0, 0, 0, 0, −1, −1, −1, 0, 0, 0]. In order to generate a code word of a symbol [−1, 0] of the tag 5, "−1" is substituted for first three 1s and "0" is substituted for the remaining three 1s in the fifth column of the determinant. By doing this, the code word of the tag 5 may be generated to be [0, 0, 0, −1, −1, −1, 0, 0, 0, 0, 0, 0]. In order to generate a code word of a symbol [1, 0] of the tag 6, "1" is substituted for first three 1s and "0" is substituted for the remaining three 1s in the sixth column of the determinant. By doing this, the code word of the tag 6 may be generated to be [0, 0, 0, 0, 0, 0, 1, 1, 1, 0, 0, 0].

That is, the code word of each tag may be generated as represented in the following Table 2.

TABLE 2

|  | SYMBOL | -> | CODE WORD |
|---|---|---|---|
| TAG 1 | [0, 1] | -> | [0, 0, 0, 1, 1, 1, 0, 0, 0, 0, 0, 0] |
| TAG 2 | [−1, 0] | -> | [−1, −1, −1, 0, 0, 0, 0, 0, 0, 0, 0, 0] |
| TAG 3 | [1, 0] | -> | [1, 1, 1, 0, 0, 0, 0, 0, 0, 0, 0, 0] |
| TAG 4 | [0, −1] | -> | [0, 0, 0, 0, 0, 0, −1, −1, −1, 0, 0, 0] |
| TAG 5 | [−1, 0] | -> | [0, 0, 0, −1, −1, −1, 0, 0, 0, 0, 0, 0] |
| TAG 6 | [1, 0] | -> | [0, 0, 0, 0, 0, 0, 1, 1, 1, 0, 0, 0] |

When the code word of each tag is generated as represented in Table 2, each tag transmits the sparse code word by reflecting the carrier wave in a NONA manner.

In the meantime, the tag which performs the operation as described above uses the sparse code to implement the NOMA, so that it has an improved connectivity as compared with TD-AmBC of the related art. The sparse code rather utilizes the duty-cycling structure of tags operating by RF energy harvesting, and the sparsity of the signal may allow the tag to implement the M-ary modulation method with only a small number of load impedances.

FIG. 8 is a view for explaining a sensor node according to an exemplary embodiment of the present disclosure.

Referring to FIG. 8, a sensor node 300 according to an exemplary embodiment of the present disclosure includes a transmitting/receiving unit 310, a state control unit 320, and a modulating unit 330.

The transmitting/receiving unit 310 is configured to receive a RF signal from an AP or a terminal device and to transmit coded data using whether a carrier wave is reflected.

The state control unit 320 accumulates energy by harvesting energy from an RF signal received from the transmitting/receiving unit in an idle state and is switched to an active state when the energy more than a predetermined threshold value is accumulated. The state control unit 320 may be switched to an active state when a received power is higher than a circuit power. For example, when the received power 500 nW>the circuit power 400 nW, the tag becomes an active state and when the received power 300 nW<the circuit power 400 nW, the tag becomes an idle state.

The modulating unit 330 projects M-ary data into a predefined mapping function to generate a symbol and spreads the symbol to generate a code word. The code word generated in this time may be coded information. By doing this, the transmitting/receiving unit 310 reflects the received carrier wave to transmit the code word.

Such a modulating unit 330 includes an M-ary data generating unit 332, a symbol generating unit 334, and a code word generating unit 336.

When the tag is switched to an active state, the M-ary data generating unit 332 generates $\log_2 M$ bit data. The $\log_2 M$ bit data generated in this time may be M-ary data.

The symbol generating unit 334 projects the M-ary data generated in the M-order data generating unit 332 into a predefined mapping function to generate a symbol. In this case, the symbol generating unit 334 generates symbols with a length of $K_1$ by the mapping function. For example, when $K_1=2$, the symbol generating unit 334 projects the M-ary data into the mapping function to be converted into a symbol with a length of 2.

The code word generating unit 336 spreads the symbol generated in the symbol generating unit 334 to generate a sparse code word. For example, the code word generating unit 336 may convert a symbol with a length of $K_1$ into a sparse code word with a length of KL.

FIG. 9 is a view illustrating an operation of an access point according to an exemplary embodiment of the present disclosure.

Referring to FIG. 9, the access point emits an RF signal in step S910 and receives a signal from at least one tag in step S920. In this case, the access point transmits a signal through a forward channel and receives a signal through a backward channel and the signal received from the tag may be a superimposed code word transmitted in the NOMA manner.

When step S920 is performed, the access point estimates a dyadic channel of the received signal using compressed sensing and channel reciprocity in step S930 and detects a code word transmitted from each tag using the estimated dyadic channel in step S940. In this case, the access point effectively estimates the dyadic channel and estimates a dyadic channel using a dyadic channel estimation algorithm (D-CEA) which allows intersymbol interference (ISI) to be utilized to detect a signal. Further, the access point may detect a code word of each tag using an iterative message passing algorithm (MPA) for successfully detecting a non-orthogonal multiple access (NOMA) signal which is coded to a sparse code by the tags.

A method for estimating a dyadic channel by the access point will be described in detail with reference to FIG. 10 and a method for detecting a code word will be described in detail with reference to FIG. 11.

FIG. 10 is a view for explaining a method for estimating a channel by an access point according to an exemplary embodiment of the present disclosure.

Referring to FIG. 10, the access point emits an RF signal in step S1010 and receives a modulation signal from at least one tag in step S1020. In this case, the access point transmits the RF signal through a forward channel and receives the modulation signal through a backward channel.

Specifically, the signal $s_k$ transmitted from the access point passes through a forward signal expressed by an impulse response $f_n = [f_n(1), \ldots, f_n(L_n^+)]^T$ so that a signal captured by a tag n is distorted due to ISI. In the meantime, a signal which is backscattered by a reflection coefficient $\Gamma_{k,n}$ in the tag to reach the access point passes through the backward channel to be distorted again. Therefore, significant parts of the received signal in the time domain are distorted.

Further, the signal sent from the access point returns to the access point via a tag again so that a channel reciprocity is established to satisfy $h_n = f_n * f_n$ and the self-interference of the access point may be canceled. Therefore, a signal $t_k$ received by the access point in a time slot k may be expressed by the following Equation 1.

$$t_k = \sum_{n=1}^{N} \frac{(F_n^+ F_n^+ s_k + F_n^+ F_n^- s_{k-1})\Gamma_{k,n}}{\overline{h}_{k,n}^+} + \sum_{n=1}^{N} \frac{(F_n^- F_n^+ s_{k-1})\Gamma_{k-1,n}}{\overline{h}_{k,n}^-} + w_k$$ [Equation 1]

Here, $W_k$ is defined as a noise and $\overline{h}_{k,n}^+$ and $\overline{h}_{k,n}^-$ are defined as a dyadic forward channel and a dyadic backward channel, respectively. $F_n^+$ and $F_n^-$ are Toeplitz matrices and are expressed by the following Equation 2.

$$F_n^+ = \sum_{i=1}^{L_n^+} f_n(i)(J_L^+)^{i-1}, \quad F_n^- = \sum_{i=1}^{L_n^+} f_n(i)(J_L^-)^{L-i+1}$$ [Equation 2]

Here, $J_L^+$ and $J_L^-$ denote a Toeplitz forward shift matrix with a size of L×L and a Toeplitz backward shift matrix, respectively.

When the signal as represented by Equation 1 is received, the access point obtains composite channel information using compressed sensing in step S1030. Here, composite channel information refers to a composite forward-backward channel and may be expressed by a vector $h_n$ with a length of L*.

When step S1030 is performed, the access point obtains an initial value of a first channel impulse response using channel reciprocity in step S1040. That is, the signal transmitted from the access point returns to the access point again via the tag so that the channel reciprocity is established to satisfy $h_n = f_n * f_n$. Therefore, the access point may obtain an initial value $f_n(1)$ of a first channel impulse response using the following Equation 3 which uses the channel reciprocity.

$$f_n(1) = \sqrt{h_n(1)}$$ [Equation 3]

When step S1040 is performed, the access point estimates an impulse response $f_n(l')$ of the remaining channel using the following Equation 4 in step s1050.

$$h_n(l')f_n(l'-i'+1)$$ [Equation 4]

Here, l' and i' are integer values representing times (for example, a sampling time 50 ns is denoted by an integer 1 and a sampling time 150 ns is denoted by an integer 3) and $h_n(l')$ denotes a random complex number denoting a channel in accordance with a time.

When the channel reciprocity is established, that is, when $h_n = f_n * f_n$, Equation 4 represents an impulse response of a composite channel. If $h_n$ is given, an equation which needs to be solved to obtain $f_n$ may be Equation 4.

For example, when a maximum length $L_n^+$ of the forward channel is 3, a length of the composite channel $h_n$ is $2L_n^+ - 1 = 5$ and components of the vector $h_n$ may be represented to be $f_n(1)$, $f_n(2)$, $f_n(3)$. That is, it is expressed as follows: $h_n(1)=f_n(1)f_n(1)$, $h_n(2)=f_n(1)f_n(2)+f_n(2)f_n(1)$, $h_n(3)=f_n(1)f_n(3)+f_n(2)f_n(2)+f_n(3)f_n(1)$, $h_n(4)=f_n(2)f_n(3)+f_n(3)f_n(2)$, $h_n(5)=f_n(3)f_n(3)$.

After performing step S1050, the access point determines whether impulse responses for all channels according to a time are estimated in step S1060.

As a result of determination in step S1060, when the impulse responses of all channels are estimated, the access point estimates dyadic channels $\tilde{h}_{k,n}^+$ and $\tilde{h}_{k,n}^-$ using the estimated impulse responses in step S1070. That is, the access point may calculate the dyadic forward channel $\tilde{h}_{k,n}^+$ and the dyadic backward channel $\tilde{h}_{k,n}^-$ using the following Equation 5.

$$\tilde{h}_{k,n}^+ = F_n^+ F_n^+ s_k + F_n^+ F_n^- s_{k-1}$$

$$\tilde{h}_{k,n}^- = F_n^- F_n^+ s_{k-1} \qquad \text{[Equation 5]}$$

When the impulse responses of all channels are not estimated as the result of determination in step S1060, the access point estimates an impulse response of a next channel in steps S1080 and S1050 and performs step S1060.

FIG. 11 is a view for explaining a method for detecting a backscatter signal according to an exemplary embodiment of the present disclosure and FIG. 12 is a view for explaining a dyadic factor graph according to an exemplary embodiment of the present disclosure.

Referring to FIG. 11, the access point performs an initializing step based on the dyadic channel in step S1110. In this case, the access point calculates initial information.

Specifically, the access point generates a dyadic factor graph in step S1111 and determines whether to consider an ISI condition in step S1112. Here, the ISI condition means whether to consider interference when a backscatter signal is detected at a specific time. For example, when a signal propagates through a channel, ISI is generated within 50 ns due to a channel delay time. Therefore, when the access point detects a signal, ISI is generated in a signal sampled at 50 ns so that signal detection considering the ISI needs to be used. Further, signals sampled at 100 ns and 150 ns exceed 50 ns so that the signals are not affected by the ISI. Therefore, a low complexity decoding technique which does not consider interference may be used therefor.

As described above, the ISI condition is a condition for determining whether the sampled backscatter signal is distorted by ISI and is determined using channel impulse response information obtained at the time of estimating a channel. For example, it is determined that a signal within a threshold time with respect to the threshold time when ISI is generated in the channel impulse response needs to consider the ISI condition.

When the ISI condition needs to be considered as a result of determination in step S1112, the access point reflects the ISI information in step S1113 to calculate initial information in step S1114 and when the ISI condition does not need to be considered, the initial information is calculated without considering the ISI information. That is, if the ISI condition needs to be considered, the access point reflects the ISI information at the time of calculating initial information of the code word, otherwise, the access point calculates initial information by the same method as the MPA of the related art.

The initial information refers to information calculated in the first step before iteration step in the message passing algorithm and is obtained by multiplying a superimposed code word by a channel and calculating a difference from a signal received at the access point. The initial information has a negative value. The larger the value (close to 0), the higher the probability of the code word in the MPA is estimated.

For example, when a received signal $y=1$, a composite channel (excluding ISI) $h_1=0.6$, a code word (excluding ISI) $B_1=1$, a composite channel (ISI component) $h_2=-0.4$, and a code word (ISI component) $B_2=-1$, the initial information may be calculated using the following Equation.

First, when the ISI is included, the initial information may be calculated using the following Equation 6.

$$I = -(y - (h_1 \times B_1 + h_2 \times B_2))^2 = 0 \qquad \text{[Equation 6]}$$

Next, when the ISI is excluded, the initial information may be calculated using the following Equation 7.

$$I = -(y - h_1 \times B_1)^2 = -0.16 \qquad \text{[Equation 7]}$$

When the ISI is included, an ISI component, that is, $B_2$ is necessary to calculate the initial information and thus a channel $h_2$ is weighted, so that code word $h_1 \times B_1 + h_2 \times B_2$ is finally obtained. Here, in order to distinguish $h_2 \times B_2$ from $h_1 \times B_1$ used in the MPA of the related art, $h_2 \times B_2$ may be defined to be a weighted sum. When the initial information is calculated by adding the weighted sum, the ISI is considered so that the distortion of the signal may be effectively corrected.

When the initial information is calculated by performing step S1110, it is determined whether the message passing process is repeated as many as a maximum number of iterations.

As a result of determination in step S1120, when the process is not repeated as many as the maximum number of iterations, the access point updates a message to be transmitted from a factor node FN to a variable node VN in step S1130.

Specifically, the access point determines whether there is ISI, based on the number of "1"s in each row from the dyadic factor graph in step S1131.

As a result of determination in step S1131, when there is ISI, the access point calculates the factor node in step S1132 to transmit the message to the variable node in step S1133.

As a result of determination in step S1131, when there is no ISI, the access point projects the code word information in step S1034 to calculate a factor node in step S1032.

As described above, when the tag uses the M-ary modulation method, in order to reduce the decoding complexity, the access point selectively projects the code word information in accordance with the ISI condition and transmits the calculated information to the variable node.

In the meantime, the factor graph is a graph representing a relationship between data and the code word when the data is coded or decoded and may be represented by the factor node and the variable node. Here, the factor node denotes a resource (for example, a time slot) used to transmit data and the variable node denotes a subject (for example, a tag) which sends the data.

The factor graph may be represented by a binary matrix having only 0 and 1. If the factor node k and the variable node n are connected to each other and the connection is represented by a matrix, a k-th row and an n-th column are given as 1 and physical meaning is that an n-th tag sends a symbol to a k-th time slot.

However, a symbol period of the tag is L which is an integer multiple of the carrier wave signal and the reception signal is distorted by the ISI during the period of ~L, so that in order to correct the distortion, the dyadic factor graph needs to be introduced.

The dyadic factor graph may be a graph obtained by cyclically shifting a forward factor graph ~G+ by ~L, obtaining a backward factor graph ~G− in which all rows excluding rows of K×~L satisfy 0, and then performing an exclusive OR operation on the forward factor graph ~G+ and the backward factor graph ~G−. Such a dyadic factor graph may be illustrated in FIG. 12.

When the forward factor graph and the backward factor graph in which K=4, L=3, N=6 may be represented as a matrix as represented in Table 3.

TABLE 3

| FORWARD FACTOR GRAPH ~G+ | | BACKWARD FACTOR GRAPH ~G− |
|---|---|---|
| [1 1 1 0 0 0] (ROW1) | -> | [0 0 1 0 1 1] |
| [1 1 1 0 0 0] (ROW2) | -> | [0 0 0 0 0 0] |
| [1 1 1 0 0 0] (ROW3) | -> | [0 0 0 0 0 0] |
| [1 0 0 1 1 0] (ROW4) | -> | [1 1 1 0 0 0] |
| [1 0 0 1 1 0] (ROW5) | -> | [0 0 0 0 0 0] |
| [1 0 0 1 1 0] (ROW6) | -> | [0 0 0 0 0 0] |
| [0 1 0 1 0 1] (ROW7) | -> | [1 0 0 1 1 0] |
| [0 1 0 1 0 1] (ROW8) | -> | [0 0 0 0 0 0] |
| [0 1 0 1 0 1] (ROW9) | -> | [0 0 0 0 0 0] |
| [0 0 1 0 1 1] (ROW10) | -> | [0 1 0 1 0 1] |
| [0 0 1 0 1 1] (ROW11) | -> | [0 0 0 0 0 0] |
| [0 0 1 0 1 1] (ROW12) | -> | [0 0 0 0 0 0] |

When the exclusive OR operation is performed on the matrix of the forward factor graph and the backward factor graph of Table 3, a dyadic factor graph ~G* as represented in the following Table 4 may be generated.

TABLE 4

| DYADIC FACTOR GRAPH ~G* |
|---|
| [1 1 1 0 1 1] (ROW1) |
| [1 1 1 0 0 0] (ROW2) |
| [1 1 1 0 0 0] (ROW3) |
| [1 1 1 1 1 0] (ROW4) |
| [1 0 0 1 1 0] (ROW5) |
| [1 0 0 1 1 0] (ROW6) |
| [1 1 0 1 1 1] (ROW7) |
| [0 1 0 1 0 1] (ROW8) |
| [0 1 0 1 0 1] (ROW9) |
| [0 1 1 1 1 1] (ROW10) |
| [0 0 1 0 1 1] (ROW11) |
| [0 0 1 0 1 1] (ROW12) |

As seen from the matrix representing the dyadic factor graph of Table 4, four rows include five "1"s and the remaining eight rows include only three "1"s. Therefore, the access point may determine whether there is ISI using the number of "1" s in each row from the dyadic factor graph. That is, the access point may determine that the number of "1"s varies at every row to determine whether there is ISI.

In Table 4, when the number of 1s is five, it is determined that there is ISI and when the number of 1s is three, it is determined that there is no ISI.

When there is ISI, there are five 1s in the row in the dyadic factor graph and as a result, the factor node needs to receive a message from five variable nodes. The message is a variable which is repeatedly updated while running the algorithm and is associated with a probability value which infers what data is sent from the tags.

When data to be sent by the tag is M-ary, the message may be expressed by a real number vector with a length of M.

For example, when there is ISI and M=4, a message which is transmitted from the factor node k to the variable node n may be expressed by '$I_{nk}(1)\ I_{nk}(2)\ I_{nk}(3)\ I_{nk}(4)$'.

In contrast, when there is no ISI, the dyadic factor graph includes three 1s and the size of the message is determined by the M value. In this case, when the M value is large, the size of the message is also large so that a computational amount in the algorithm is undesirably increased. Therefore, in order to reduce the size of the message vector to be smaller than M, a "projection" method is necessary.

If there is no ISI, the signal is not distorted. Therefore, when a property of a predefined mapping function is used, the M-ary data may be compressed into a number of symbols less than M. Therefore, the complexity of the decoding process is reduced during this process and a computation speed becomes faster.

For example, when M is 4, a '$I_{nk}(1)\ I_{nk}(2)\ I_{nk}(3)\ I_{nk}(4)$' message whose size before projection is 4 may be reduced to a '$\sim I_{nk}(1)\ \sim I_{nk}(2)\ \sim I_{nk}(3)$' message whose size after projection is 3.

When step S1130 is performed, the access point updates the variable node based on the passed message (VN update step) in step S1140.

Specifically, the access point determines whether there is ISI, based on the number of "1" s in each row from the dyadic factor graph in step S1141.

As a result of determination in step s1141, when there is ISI, the access point calculates the variable node in step S1142 to transmit the message to the factor node in step S1143.

As a result of determination in step S1141, when there is no ISI, the access point spreads projected code word information in step S1144 to calculate a variable node in step S1142.

As described above, when the ISI needs to be considered, the access point calculates the variable node to transmit a message including update information to the factor node and when ISI does not need to be considered, the access point expands the projected information and calculates the variable node to transmit the updated information to the factor node again.

There is an advantage in that code word information projection and expansion method by the access point may reduce the complexity for detecting a code word even though the tag uses the M-ary modulation method.

The above-described message passing process is repeated as many as the maximum number of iterations and when it is satisfied, the access point outputs a log-likelihood ratio in step S1150.

The access point may effectively detect data transmitted by the tag using the log-likelihood ratio even in a RF environment where there is ISI.

The log-likelihood ratio is a value representing each bit probability and has a real number value. When there is M-ary data, a size of the log-likelihood ratio is $\log_2 M$ and the output log-likelihood ratio is used to decode the data. If the log-likelihood ratio is a positive value, data is decoded to be 0 and if the log-likelihood ratio is a negative value, data is decoded to be 1.

For example, when M=4, if a log likelihood ratio of tag 1 is [−2.6 0.5], a log likelihood ratio of tag 2 is [1.2 0.3], and a log likelihood ratio of tag 3 is [1.3-0.9], the access point may detect decoding data of the tag 1 [10], decoding data of the tag 2 [00], and decoding data of the tag 3 [01], respectively.

FIG. 13 is a view for explaining a configuration of an access point according to an exemplary embodiment of the present disclosure.

Referring to FIG. 13, an access point 100 according to an exemplary embodiment of the present disclosure includes a transmitting/receiving unit 110, a channel estimating unit 120, and a signal detecting unit 130.

The transmitting/receiving unit 110 emits a RF signal and receives signals which are transmitted from a plurality of sensor nodes in a non-orthogonal multiple access (NOMA) manner.

The channel estimating unit 120 estimates a dyadic channel of the received signal using compressed sensing and channel reciprocity. That is, the channel estimating unit 120 obtains composite channel information using the compressed sensing and calculates an initial value of a first channel impulse response using the channel reciprocity based on the composite channel information. Thereafter, the channel estimating unit 120 estimates impulse responses of the remaining channels according to the time, based on the initial value of the first channel impulse response and estimates the dyadic forward channel and the dyadic backward channel using the impulse response of the estimated channels.

The signal detecting unit 130 repeatedly updates information of the factor node and the variable node as many as a predetermined number of iterations in consideration of the dyadic channel estimated in the channel estimating unit 120 and the intersymbol interference (ISI) and detects the data of the plurality of sensor nodes based on the updated result. That is, the signal detecting unit 130 generates a dyadic factor graph, determines whether there is ISI based on the dyadic factor graph, updates the information of the factor node by selectively projecting the code word information in accordance with the determination result, and spreads the projected code word information depending on whether there is the ISI to update the information of the variable node. Thereafter, when the information of the factor node and the variable node is updated as many as a predetermined number of iterations, the signal detecting unit 130 outputs the log-likelihood ratio and detects the data of the sensor nodes based on the log-likelihood ratio.

Hereinafter, a performance of a sparse-coded AmBC system according to the present disclosure will be described.

FIG. 14 is a graph for comparing M-ary modulation performances of an SC-AmBC manner of the present disclosure and a TD-AmBC manner of the related art.

Referring to FIG. 14, in the case of SC-AmBC, when M is 2 or 8, a RF energy harvesting efficiency is slightly lower than that of TD-AmBC but when M is 4, the energy harvesting efficiency is improved by the symbol mapping so that there is no difference in performance. In contrast, it is confirmed that a bit-error rate of the SC-AmBC is significantly better than the bit-error rate of the TD-AmBC. This is because the backscatter signal is spread through the NOMA in the time domain to obtain a diversity gain. As described above, the SC-AmBC may make hardware of the tag simple and successfully implement the M-ary modulation.

FIG. 15 is a graph for comparing duty-cycling operation performances of an SC-AmBC manner of the present disclosure and a TD-AmBC manner of the related art.

Referring to FIG. 15, in the TD-AmBC manner, a duty cycle is given to be D=1/K. When the number of tags N=K is increased, there is a problem in that the duty cycle is reduced so that a time available for the tag to transmit data is scaled down. In contrast, in the SC-AmBC manner of the present disclosure, a scaling phenomenon of the duty cycling is reversed to the sparsity of the signal so that the number of tags to be connected to the access point is scaled by an overloading factor, $\lambda > 1$, to be significantly increased to be $N = \lambda K$. Moreover, the sparse code word may provide a diversity gain in the dyadic channel structure so that as compared with the technique of the related art, massive connectivity is supported and the bit-error rate is reduced simultaneously.

FIG. 16 is a graph for comparing performances in a dyadic channel of an SC-AmBC manner of the present disclosure and a TD-AmBC manner of the related art; and FIG. 17 is a graph for comparing performances according to a reflection coefficient of an SC-AmBC manner of the present disclosure and a TD-AmBC manner of the related art.

Referring to FIG. 16, the RF energy harvesting probability tends to improve as the number of multiple paths is increased. In contrast, in the case of the MPA and the TD-AmBC techniques of the related art, the bit-error rate is lowered as the multiple paths are increased because the ISI distorts the reception signal. The D-MPA technique of the present invention reflects a characteristic of the dyadic channel so that the bit-error rate is smaller than that of the MPA technique of the related art which does not reflect the characteristic of the dyadic channel. Further, as compared with the TD-AmBC technique of the related art, the performance is significantly improved. As described above, when the D-MPA and D-CEA of the present disclosure are utilized, the distortion is corrected so that the larger the multiple paths, the better the signal detecting performance. Therefore, the SC-AmBC of the present invention shows better performance in the dyadic channel.

Further, according to the SC-AmBC technique, it is confirmed that the sparsity of the signal is utilized to detect signal at the receiving end so that as illustrated in FIG. 17, a much higher transmission rate than that of the TD-AmBC may be obtained in accordance with a reflection coefficient $\Gamma_{k,n}$, a modulation order M, and a cord word related variable K in the tag and the performance may be flexibly adjusted.

Since in the TD-AmBC of the related art, the sparsity of the signal is not used, the connectivity is low and consequently, the transmission rate is low. However, in the SC-AmBC of the present disclosure, the sparsity of the signal is utilized for backscattering so that massive connectivity may be supported. Therefore, the graph entirely moves to a Y-axis direction so that an improved connectivity may be obtained. The connectivity is adjusted by the reflection coefficient, the modulation order, and the code word related variable so that it is understood that generally, the SC-AmBC more flexibly tunes the system variable to adjust the backscatter performance.

As described above, the sparse code does not discard the MAI and ISI but utilizes the MAI and ISI to support the massive connectivity and reduce the bit-error rate as compared with the existing technique.

For now, the present invention has been described with reference to the exemplary embodiments. It is understood to those skilled in the art that the present invention may be implemented as a modified form without departing from an essential characteristic of the present invention. Therefore, the disclosed exemplary embodiments may be considered by way of illustration rather than limitation. The scope of the present invention is presented not in the above description but in the claims and it may be interpreted that all differences within an equivalent range thereto may be included in the present invention.

What is claimed is:

1. A sparse-coded ambient backscatter communication method in an ambient backscatter system including an access point and a plurality of sensor nodes, the method comprising:
accumulating, by at least one sensor node of the plurality of sensor nodes, energy by harvesting energy from a RF signal emitted from the access point;
generating, by the at least one sensor node, M-ary data when a predetermined threshold or more energy is accumulated to be switched into an active state;
generating, by the at least one sensor node, a symbol by projecting the M-ary data into a predefined mapping function;
generating, by the at least one sensor node, a code word by spreading the symbol;
transmitting, by the at least one sensor node, the code word to the access point by reflecting a carrier wave received from the access point,
wherein the at least one sensor node of the plurality of sensor nodes transmits the code word, in a non-orthogonal multiple access (NOMA) manner, to the access point;
estimating, by the access point, a dyadic channel of a received signal including the code word transmitted from the at least one sensor node; and
repeatedly updating, by the access point, information of a factor node and a variable node in consideration of the estimated dyadic channel and intersymbol interference (ISI), and detecting, by the access point, data of the plurality of sensor nodes based on the updated result.

2. The sparse-coded ambient backscatter communication method according to claim 1, wherein the symbol is generated by at least one of 1, 0, −1 and has an active time slot length.

3. The sparse-coded ambient backscatter communication method according to claim 1, wherein the code word is a sparse code word having a length corresponding to a multiplication of a number of time slots and a symbol period.

4. The sparse-coded ambient backscatter communication method according to claim 1, wherein the code word is transmitted to the access point through the dyadic channel.

5. A sparse-coded ambient backscatter communication method in an ambient backscatter system including an access point and a plurality of sensor nodes, the method comprising:
accumulating energy by harvesting energy from a RF signal emitted from the access point;
generating M-ary data when a predetermined threshold or more energy is accumulated to be switched into an active state;
generating a symbol by projecting the M-ary data into a predefined mapping function;
generating a code word by spreading the symbol; and
transmitting the code word by reflecting a carrier wave received from the access point;
wherein the plurality of sensor nodes transmits the code word in a non-orthogonal multiple access (NOMA) manner, wherein the method further comprises:
receiving a signal transmitted from the plurality of sensor nodes in the non-orthogonal multiple access (NOMA) manner;
estimating a dyadic channel of the received signal using compressed sensing and channel reciprocity; and
repeatedly updating information of a factor node and a variable node as many as a predetermined number of iterations in consideration of the estimated dyadic channel and intersymbol interference (ISI) and detecting data of the plurality of sensor nodes based on the updated result.

6. The sparse-coded ambient backscatter communication method according to claim 5, wherein the received signal is a signal propagating through a dyadic forward channel and a dyadic backward channel.

7. The sparse-coded ambient backscatter communication method according to claim 5, wherein the estimating of a dyadic channel includes:
obtaining composite channel information using the compressed sensing;
calculating an initial value of a first channel impulse response using the channel reciprocity based on the composite channel information;
estimating an impulse response of the remaining channels according to a time based on the initial value of the first channel impulse response; and
estimating a dyadic forward channel and a dyadic backward channel using the estimated impulse response of the channels.

8. The sparse-coded ambient backscatter communication method according to claim 7, wherein the dyadic forward channel $\tilde{h}_{k,n}^+$ and the dyadic backward channel $\tilde{h}_{k,n}^-$ are estimated using the following Equation, $$\tilde{h}_{k,n}^+ = F_n^+ F_n^+ s_k + F_n^+ F_n^- s_{k-1}$$

$$\tilde{h}_{k,n}^- = F_n^- F_n^+ s_{k-1} \qquad \text{Equation}$$

(Here, $s_k$ is a signal transmitted in a time slot k, $s_{k-1}$ is a signal transmitted in a time slot k−1, $F_n^+$ and $F_n^-$ are Toeplitz matrices.)

9. The sparse-coded ambient backscatter communication method according to claim 5, wherein the detecting of data of the plurality of sensor nodes includes:
generating a dyadic factor graph;
determining whether ISI information is reflected based on a channel impulse response obtained at the time of estimating the dyadic channel and calculating initial information by selectively reflecting the ISI information in accordance with the determination result;
determining whether there is the ISI based on the dyadic factor graph, selectively projecting code word information in accordance with the determination result to update information of a factor node, and transmitting a first message including the updated information to the variable node;
determining whether there is the ISI based on the message, selectively spreading the projected code word information in accordance with the determination result to update information of the variable node, and transmitting a second message including the updated information to the factor node;
outputting a log-likelihood ratio when the process of transmitting the first message and the second message is repeated as many as the number of iterations; and
detecting data of each sensor node based on the log-likelihood ratio.

10. The sparse-coded ambient backscatter communication method according to claim 9, wherein in the calculating of initial information, with respect to a threshold time when the ISI is generated in the channel impulse response, a signal within the threshold time reflects the ISI information to calculate the initial information.

11. The sparse-coded ambient backscatter communication method according to claim 9, wherein the transmitting of a first message to a variable node includes:

determining whether there is the ISI based on the number of "1"s of each row in the dyadic factor graph; and calculating the first message with a size of M in the factor node to transmit the first message to the variable node when there is the ISI as a result of determination and to transmit the first message with a size of $\tilde{M}=\min(M, 3)$ by projecting the code word information when there is no ISI.

12. The sparse-coded ambient backscatter communication method according to claim 9, wherein the transmitting of a second message to the factor node includes:

determining whether there is the ISI based on the number of "1"s of each row in the dyadic factor graph; and calculating the second message with a size of M in the variable node without projection to transmit the second message to the factor node when there is ISI as a result of determination and transmit the second message with a size of M by spreading information of the projected code word with a size of $\tilde{M}$ to the factor node when there is no ISI.

13. The sparse-coded ambient backscatter communication method according to claim 9, wherein in the detecting of data of each sensor node, when the log-likelihood ratio is a positive value, the data is decoded to be "0" and when the log likelihood ratio is a negative value, the data is decoded to be "−1" to detect the code word of each sensor node.

14. A sparse-coded ambient backscatter system, comprising:

a plurality of sensor nodes configured to accumulate energy by harvesting energy from an ambient RF signal, generate a symbol by projecting M-ary data into a predefined mapping function when a predetermined threshold or more energy is accumulated to be switched into an active state, spread the symbol to generate a sparse code word, and transmit the sparse code word in a non-orthogonal multiple access (NOMA) manner by reflecting a carrier wave received from an access point; and an access point configured to estimate a dyadic channel of a signal received from the plurality of sensor nodes using compressed sensing and channel reciprocity, repeatedly update information of a factor node and a variable node as many as a predetermined number of iterations in consideration of the estimated dyadic channel and intersymbol interference (ISI), and detect data of the plurality of sensor nodes based on the updated result.

15. The sparse-coded ambient backscatter communication system according to claim 14, wherein a sensor node, of the plurality of sensor nodes, includes:

a transmitting/receiving unit for communication with the access point;

a state control unit which accumulates energy by harvesting energy from the RF signal received through the transmitting/receiving unit in an idle state and is switched into the active state when the predetermined threshold or more energy is accumulated; and a modulating unit which projects the M-ary data into the predefined mapping function to generate the symbol when it is switched into the active state, and transmits the code word by reflecting the carrier wave received from the access point.

16. The sparse-coded ambient backscatter communication system according to claim 14, wherein an access point, of the plurality of sensor nodes, includes:

a transmitting/receiving unit which receives the signal transmitted from the plurality of sensor nodes in the non-orthogonal multiple access (NOMA) manner;

a channel estimating unit which estimates the dyadic channel of the received signal using the compressed sensing and the channel reciprocity; and a signal detecting unit which repeatedly updates information of the factor node and the variable node as many as a predetermined number of iterations in consideration of the estimated dyadic channel and the intersymbol interference (ISI) and detects data of the plurality of sensor nodes based on the updated result.

17. The sparse-coded ambient backscatter communication system according to claim 16, wherein the channel estimating unit obtains composite channel information using the compressed sensing, calculates an initial value of a first channel impulse response using the channel reciprocity based on the composite channel information, estimates an impulse response of the remaining channels in accordance with a time based on the initial value of the first channel impulse response, and estimates a dyadic forward channel and a dyadic backward channel using the estimated impulse response of the channel.

18. The sparse-coded ambient backscatter communication system according to claim 16, wherein the signal detecting unit generates a dyadic factor graph, determines whether there is the ISI based on the dyadic factor graph, updates information of the factor node by selectively projecting code word information in accordance with a determination result, updates information of the variable node by spreading the projected code word information depending on whether there is the ISI, outputs a log-likelihood ratio when the information of the factor node and the variable node is updated as many as the number of iterations, and detects data of each sensor node based on the log-likelihood ratio.

* * * * *